United States Patent
Miyazawa et al.

(10) Patent No.: US 7,287,840 B2
(45) Date of Patent: Oct. 30, 2007

(54) PIEZOELECTRIC ELEMENT, PIEZOELECTRIC ACTUATOR, INK JET RECORDING HEAD, INK JET PRINTER, SURFACE ACOUSTIC WAVE ELEMENT, FREQUENCY FILTER, OSCILLATOR, ELECTRONIC CIRCUIT, THIN FILM PIEZOELECTRIC RESONATOR AND ELECTRONIC APPARATUS

(75) Inventors: Hiromu Miyazawa, Nagano (JP); Motohisa Noguchi, Nagano (JP); Takeshi Kijima, Nagano (JP)

(73) Assignee: Seiko Epson Corporation (JP)

( * ) Notice: Subject to any disclaimer, the term of this patent is extended or adjusted under 35 U.S.C. 154(b) by 354 days.

(21) Appl. No.: 11/130,348

(22) Filed: May 16, 2005

(65) Prior Publication Data

US 2005/0253904 A1 Nov. 17, 2005

(30) Foreign Application Priority Data

May 17, 2004 (JP) ............................. 2004-146944

(51) Int. Cl.
*B41J 2/045* (2006.01)
*C04B 35/00* (2006.01)
*H02N 41/00* (2006.01)

(52) U.S. Cl. .................... 347/68; 347/70; 252/62.9 PZ; 310/358

(58) Field of Classification Search ................ 347/68, 347/70; 252/62.9 R, 62.9 PZ; 310/358
See application file for complete search history.

(56) References Cited

U.S. PATENT DOCUMENTS 6,613,687 B2 * 9/2003 Hart et al. .................. 438/710
2003/0222947 A1 * 12/2003 Tomozawa et al. ........... 347/68

FOREIGN PATENT DOCUMENTS

JP 2001-223404 8/2001

* cited by examiner

*Primary Examiner*—Stephen Meier
*Assistant Examiner*—Sarah Al-Hashimi
(74) *Attorney, Agent, or Firm*—Harness, Dickey & Pierce, P.L.C.

(57) ABSTRACT

A piezoelectric element includes a base substrate, a buffer layer formed above the base substrate, a piezoelectric film formed above the buffer layer, and a barrier layer formed above the piezoelectric film, wherein the buffer layer and the barrier layer are formed of $Pb((Zr_{1-x}Ti_x)_{1-y}Nb_y)O_3$ of a perovskite type, where x is in a range of $0 \leq x \leq 1$, and y is in a range of $0.05 \leq y \leq 0.3$, and the piezoelectric film is formed of a relaxor material of a perovskite type.

20 Claims, 10 Drawing Sheets

RANSMITTER 80,
TRANSMISSION SIGNAL
PROCESSING CIRCUIT 81,
TRANSMISSION MIXER 82,
TRANSMISSION FILTER 83,
TRANSMISSION POWER
AMPLIFIER 84,
TRANSCEIVER WAVE DIVIDER 85,
ANTENNAS 86a, 86b,
LOW NOISE AMPLIFIER 87,
RECEPTION FILTER 88,
RECEPTION MIXER 89,
RECEPTION SIGNAL
PROCESSING CIRCUIT 90,
RECEIVER 91,
FREQUENCY SYNTHESIZER 92,
CONTROL CIRCUIT 93, and
IPUT/DISPLAY CIRCUIT 94

PIEZOELECTRIC ELEMENT, PIEZOELECTRIC ACTUATOR, INK JET RECORDING HEAD, INK JET PRINTER, SURFACE ACOUSTIC WAVE ELEMENT, FREQUENCY FILTER, OSCILLATOR, ELECTRONIC CIRCUIT, THIN FILM PIEZOELECTRIC RESONATOR AND ELECTRONIC APPARATUS

RELATED APPLICATIONS

This application claims priority to Japanese Patent Application No. 2004-146944 filed May 17, 2004 which is hereby expressly incorporated by reference herein in its entirety.

BACKGROUND

1. Technical Field

The present invention relates to piezoelectric elements, piezoelectric actuators, ink jet recording heads, ink jet printers, surface acoustic wave elements, frequency filters, oscillators, electronic circuits, thin film piezoelectric resonators, and electronic apparatuses, which have piezoelectric films.

2. Related Art

An inkjet printer is known as a printer that enables a high resolution picture quality and a high-speed printing. An inkjet printer is equipped with an ink jet recording head that has a cavity whose volume changes. In the inkjet printer, while an ink jet recording head is scanned, ink droplets are discharged from its nozzles, whereby printing is performed. As a head actuator in the ink jet recording head for such an inkjet printer, a piezoelectric element that uses a piezoelectric film, which is represented by PZT ($Pb(Zr, Ti)O_3$), is conventionally used (see, for example, Japanese Laid-open Patent Application 2001-223404).

Moreover, because the characteristics of surface acoustic wave elements, frequency filters, oscillators, and electronic circuits are desired to be improved, excellent products with novel piezoelectric materials are desired to be supplied.

It is noted that higher picture quality and faster printing speed are in demand in inkjet printers. To meet such a demand, the technology to make nozzles in an ink jet recording head to have a higher density becomes indispensable. In order to achieve this, piezoelectric elements (head actuators) that are laminated over cavities, and in particular, the characteristics of piezoelectric films, in other words, their piezoelectric constant need to be improved.

It is an object of the present invention to provide piezoelectric elements having piezoelectric films with excellent piezoelectric characteristics. Also, it is another object of the present invention to provide piezoelectric actuators, ink jet recording heads, ink jet printers, surface acoustic wave elements, frequency filters, oscillators, electronic circuits, thin film piezoelectric resonators, and electronic apparatuses, which use the piezoelectric films.

SUMMARY

A piezoelectric element in accordance with the present invention includes: a base substrate; a buffer layer formed above the base substrate; a piezoelectric film formed above the buffer layer; and a barrier layer formed above the piezoelectric film, wherein the buffer layer and the barrier layer are formed of $Pb((Zr_{1-x}Ti_x)_{1-y}Nb_y)O_3$ of a perovskite type, where x is in a range of $0 \leq x \leq 1$, and y is in a range of $0.05 \leq y \leq 0.3$, and the piezoelectric film is formed of a relaxor material of a perovskite type.

In the present invention, the base substrate includes one layer or a plurality of layers.

In the present invention, a specific object (hereafter referred to as "B") above another specific object (hereafter referred to as "A") includes B that is formed directly on A, and B that is formed over A through another object on A.

The piezoelectric element includes the buffer layer that is formed of $Pb((Zr_{1-x}Ti_x)_{1-y}Nb_y)O_3$ (hereafter also referred to as "PZTN") formed above the base substrate, and the piezoelectric film that is formed of a relaxor material formed above the buffer layer. PZTN can be formed into a dense thin film above the base substrate with its orientation being controlled. Further, above the dense PZTN that is once formed, a relaxor material in a dense thin film can be readily laminated. Accordingly, the piezoelectric element can have a piezoelectric film with excellent piezoelectric characteristics. In other words, the piezoelectric element has a high piezoelectric constant, and exhibits a larger deformation to a voltage applied.

In the piezoelectric element in accordance with the present invention, the buffer layer may have a rhombohedral structure, and may preferentially be oriented to pseudo cubic (100).

In the present invention, being "preferentially oriented" includes a case where 100% of the crystals are in a desired orientation that is a pseudo cubic (100) orientation, and a case where most of the crystals (for example, 90% or more) are in a desired cubic (100) orientation, and the remaining crystals are in another orientation (for example, (111) orientation).

In the piezoelectric element in accordance with the present invention, the buffer layer may have a pseudo cubic structure, and may preferentially be oriented to pseudo cubic (100).

In the piezoelectric element in accordance with the present invention, the barrier layer may have a rhombohedral structure, and may preferentially be oriented to pseudo cubic (100).

In the piezoelectric element in accordance with the present invention, the barrier layer may have a pseudo cubic structure, and may preferentially be oriented to pseudo cubic (100).

In the piezoelectric element in accordance with the present invention, the piezoelectric film may have a rhombohedral structure, and may preferentially be oriented to pseudo cubic (100).

In the piezoelectric element in accordance with the present invention, the relaxor material may be formed of at least one type of materials shown by formulae (1)-(9) as follows:

$$(1-x)Pb(Sc_{1/2}Nb_{1/2})O_3 - xPb(Zr_{1-y}Ti_y)O_3 \qquad \text{Formula (1)}$$

(where, x is $0.10 < x < 0.42$, and y is $0 \leq y \leq 1$)

$$(1-x)Pb(In_{1/2}Nb_{1/2})O_3 - xPb(Zr_{1-y}Ti_y)O_3 \qquad \text{Formula (2)}$$

(where, x is $0.10 < x < 0.37$, and y is $0 \leq y \leq 1$)

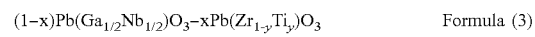

$$(1-x)Pb(Ga_{1/2}Nb_{1/2})O_3 - xPb(Zr_{1-y}Ti_y)O_3 \qquad \text{Formula (3)}$$

(where, x is $0.10 < x < 0.50$, and y is $0 \leq y \leq 1$)

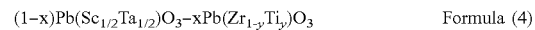

$$(1-x)Pb(Sc_{1/2}Ta_{1/2})O_3 - xPb(Zr_{1-y}Ti_y)O_3 \qquad \text{Formula (4)}$$

(where, x is $0.10 < x < 0.45$, and y is $0 \leq y \leq 1$)

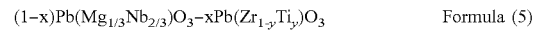

$$(1-x)Pb(Mg_{1/3}Nb_{2/3})O_3 - xPb(Zr_{1-y}Ti_y)O_3 \qquad \text{Formula (5)}$$

(where, x is $0.10 < x < 0.35$, and y is $0 \leq y \leq 1$)

$(1-x)Pb(Fe_{1/2}Nb_{1/2})O_3-xPb(Zr_{1-y}Ti_y)O_3$  Formula (6)

(where, x is 0.01<x<0.10, and y is $0 \leq y \leq 1$)

$(1-x)Pb(Zn_{1/3}Nb_{2/3})O_3-xPb(Zr_{1-y}Ti_y)O_3$  Formula (7)

(where, x is 0.01<x<0.10, and y is $0 \leq y \leq 1$)

$(1-x)Pb(Ni_{1/3}Nb_{2/3})O_3-xPb(Zr_{1-y}Ti_y)O_3$  Formula (8)

(where, x is 0.10<x<0.38, and y is $0 \leq y \leq 1$)

$(1-x)Pb(Co_{1/2}W_{1/2})O_3-xPb(Zr_{1-y}Ti_y)O_3$  Formula (9)

(where, x is 0.10<x<0.42, and y is $0 \leq y \leq 1$)

In the piezoelectric element in accordance with the present invention, the relaxor material may be formed of at least one type of materials shown by formulae (1)-(9) as follows:

$(1-x)Pb(Sc_{1/2}Nb_{1/2})O_3-xPbTiO_3$  Formula (1)

(where, x is 0.10<x<0.42)

$(1-x)Pb(In_{1/2}Nb_{1/2})O_3-xPbTiO_3$  Formula (2)

(where, x is 0.10<x<0.37)

$(1-x)Pb(Ga_{1/2}Nb_{1/2})O_3-xPbTiO_3$  Formula (3)

(where, x is 0.10<x<0.50)

$(1-x)Pb(Sc_{1/2}Ta_{1/2})O_3-xPbTiO_3$  Formula (4)

(where, x is 0.10<x<0.45)

$(1-x)Pb(Mg_{1/3}Nb_{2/3})O_3-xPbTiO_3$  Formula (5)

(where, x is 0.10<x<0.35)

$(1-x)Pb(Fe_{1/2}Nb_{1/2})O_3-xPbTiO_3$  Formula (6)

(where, x is 0.01<x<0.10)

$(1-x)Pb(Zn_{1/3}Nb_{2/3})O_3-xPbTiO_3$  Formula (7)

(where, x is 0.01<x<0.10)

$(1-x)Pb(Ni_{1/3}Nb_{2/3})O_3-xPbTiO_3$  Formula (8)

(where, x is 0.10<x<0.3.8)

$(1-x)Pb(Co_{1/2}W_{1/2})O_3-xPbTiO_3$  Formula (9)

(where, x is 0.10<x<0.42)

In the piezoelectric element in accordance with the present invention, the buffer layer and barrier layer may include Si, or Si and Ge by 5 mol % or less.

The piezoelectric element in accordance with the present invention may include a lower electrode formed above the base substrate, the buffer layer formed above the lower electrode, and an upper electrode formed above the barrier layer.

In the piezoelectric element in accordance with the present invention, at least one of the lower electrode and the upper electrode may be formed from a material mainly formed of Pt.

The piezoelectric element in accordance with the present invention may be used in an ink jet recording head equipped with a cavity having a volume that is changeable, wherein the volume of the cavity can be changed by a deformation of the piezoelectric film.

A piezoelectric actuator in accordance with the present invention may have the piezoelectric element described above.

An ink jet recording head in accordance with the present invention may have the piezoelectric element described above.

An ink jet printer may have the ink jet recording head described above.

A surface acoustic wave element in accordance with the present invention may have the piezoelectric element described above formed above a substrate.

A frequency filter in accordance with the present invention may include: a first electrode that is formed above the piezoelectric film of the surface acoustic wave element described above; and a second electrode that is formed above the piezoelectric film, resonates at a specified frequency or a specified band frequency in surface acoustic waves generated in the piezoelectric film by an electrical signal applied to the first electrode, and converts the specified frequency or the specified band frequency to an electrical signal.

An oscillator in accordance with the present invention may include: an electrical signal application electrode that is formed above the piezoelectric film of the surface acoustic wave element described above, and generates surface acoustic waves in the piezoelectric film by an electrical signal applied, and an oscillation circuit including a resonation electrode that is formed above the piezoelectric film, and resonates at a specified frequency or a specified band frequency in the surface acoustic waves generated by the electrical signal application electrode, and transistors.

An electronic circuit in accordance with the present invention may include: the oscillator described above; and an electrical signal supplying element that applies the electrical signal to the electrical signal application electrode provided in the oscillator, wherein the electronic circuit may have the functions to select a specified frequency component from frequency components of the electrical signal or convert the frequency components to a specified frequency, or to give a predetermined modulation to the electrical signal to conduct a predetermined demodulation or conduct a predetermined detection.

A thin film piezoelectric resonator in accordance with the present invention may be formed such that a resonator having the piezoelectric element described above is formed above a substrate.

An electronic apparatus in accordance with the present invention may include at least one of the frequency filter described above, the oscillator described above, the electronic circuit described above, and the thin film piezoelectric resonator described above.

DETAILED DESCRIPTION

Preferred embodiments of the present invention are described in detail below with reference to the accompanying drawings.

1-1. Piezoelectric Element

Figure 1:
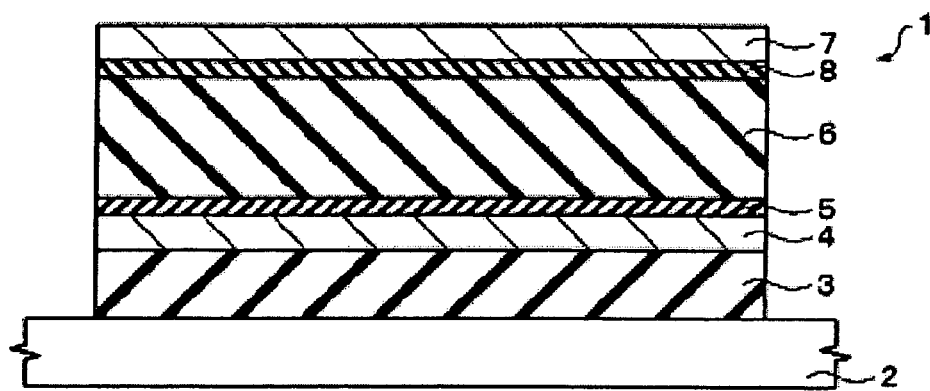
FIG. 1 is a cross-sectional view showing a piezoelectric element in accordance with an embodiment.

FIG. 1 is a view showing an embodiment in which a piezoelectric element of the present invention is applied to a piezoelectric element 1 that becomes to be a head actuator, in particular, for an ink jet recording head.

The piezoelectric element 1 includes a substrate 2 formed of silicon (Si), an elastic film 3 formed on the substrate 2, a lower electrode 4 formed on the elastic film 3, a buffer layer 5 formed on the lower electrode 4, a piezoelectric film 6 formed on the buffer layer 5, a barrier layer 8 formed on the piezoelectric film 6, and an upper electrode 7 formed on the barrier layer 8. It is noted here that, in the present embodiment, a portion from the substrate 2 up to the lower electrode 4 is referred to as a base substrate.

As the substrate 2, for example, a single-crystal silicon substrate with a (100) orientation, a single-crystal silicon substrate with a (111) orientation, or a silicon substrate with a (110) orientation can be used. Also, a substrate having an amorphous oxide silicon film such as a thermal oxidation film, a natural oxidation film or the like formed on its surface can be used.

The elastic film 3 is a film that functions as an elastic plate in the piezoelectric element that becomes a head actuator for an inkjet recording head. The elastic film 3 has a thickness of, for example, about 1 μm. The elastic film 3 may be formed with a material that can take a sufficient selection ratio with the substrate 2, such that the elastic film 3 functions as an etching stopper layer when a cavity is formed by etching the substrate 2, as described below. More specifically, for example, when the substrate 2 is formed of silicon, the elastic film 3 may be formed of $SiO_2$, $ZrO_2$ or the like. It is noted that, if multiple piezoelectric elements 1 are formed on the substrate 2 that becomes an ink chamber substrate in the inkjet recording head to be described below, the elastic film 3 can be formed as a common elastic plate for the plurality of piezoelectric elements 1.

The lower electrode 4 becomes to be one of electrodes for applying a voltage to the piezoelectric film 6. The lower electrode 4 is formed, for example, in the same plane configuration as that of the piezoelectric film 6 and the upper electrode 7. If multiple piezoelectric elements 1 are formed on the substrate 2 that becomes an ink chamber substrate in the inkjet recording head to be described below, the lower electrode 4 can be formed in the same plane configuration as that of the elastic film 3 that defines a common elastic plate, so as to function as a common electrode for the plurality of piezoelectric elements 1. The lower electrode 4 may be composed of platinum (Pt), iridium (Ir), iridium oxide ($IrO_x$), titanium (Ti), or the like. The lower electrode 4 is formed to a thickness of, for example, about 100 nm-200 nm.

The buffer layer 5 is formed of $Pb((Zr_{1-x}Ti_x)_{1-y}Nb_y)O_3$ (hereafter also referred to as "PZTN") of a perovskite type with a rhombohedral structure or a pseudo cubic structure, and is preferentially oriented to pseudo cubic (100). x is in a range of $0 \leq x \leq 1$ and y is in a range of $0.05 \leq y \leq 0.3$.

It is noted here that the "pseudo cubic structure" includes, for example, a rhombohedral structure, a tetragonal structure, and a monoclinic structure. The buffer layer 5 is formed into a film on the lower electrode 4 by a liquid phase method or a vapor phase method. The buffer layer 5 can be made preferentially oriented to pseudo cubic (100) by appropriately controlling, in particular, the temperature condition (heating condition) at the time of film formation. It is noted here that the case of "being preferentially oriented" can include a case in which all of the crystals are in a desired orientation that is a pseudo cubic (100) orientation, and a case where most of the crystals are in a desired orientation of pseudo cubic (100), and the remaining crystals that are not in a pseudo cubic (100) orientation are in other orientations. When most of the crystals are oriented to a desired pseudo cubic (100) orientation, and when the piezoelectric film 6 is formed on the buffer layer 5 as described below, the piezoelectric film 5 succeeds the crystal structure of the buffer layer 5, and has the same crystal structure, in other words, is preferentially oriented to pseudo cubic (100).

The buffer layer 5 may include silicon (Si), or silicon and germanium (Ge) by 5 mol % or less. Its detail will be described below in the section "Method for Manufacturing Piezoelectric Element."

Because the buffer layer 5 is formed of a piezoelectric material, it influences the piezoelectric characteristics (helps the piezoelectric characteristics) of the piezoelectric film 6 to be described below. Therefore, if the film thickness of the buffer layer 5 becomes too large, the influence on the piezoelectric characteristics of the piezoelectric film 6 becomes too large. Accordingly, the thickness of the buffer layer 5 may preferably be 100 nm or less, and more preferably, 50 nm or less, such that the influence does not grow more than necessary. Also, the buffer layer 5 may preferably have a film thickness that can securely exhibit the functions as a buffer layer. More specifically, the film thickness of the buffer layer 5 may preferably be 10 nm or greater.

The piezoelectric film 6 is formed from a relaxor material that has a perovskite type with a rhombohedral structure, and preferentially oriented to pseudo cubic (100), and is formed to a thickness of about 500 nm-1000 nm. Also, a typical film thickness of the piezoelectric film 6 is 300 nm to 3.0 μm. The upper limit of the thickness is not limited, as long as it is within the range to sustain the density and the crystal orientation as a thin film, and may be allowed up to 10 µm.

As the relaxor material, for example, materials shown by the following formulae (1)-(9) can be enumerated. One type or a plurality of types selected from among these materials is formed into a film by a liquid phase method or a vapor phase method, whereby the piezoelectric film 6 can be obtained.

$(1-x)Pb(Sc_{1/2}Nb_{1/2})O_3-xPb(Zr_{1-y}Ti_y)O_3$   Formula (1)

(where, x is 0.10<x<0.42, preferably 0.20<x<0.42, and y is 0≦y≦1)

$(1-x)Pb(In_{1/2}Nb_{1/2})O_3-xPb(Zr_{1-y}Ti_y)O_3$   Formula (2)

(where, x is 0.10<x<0.37, preferably 0.20<x<0.37, and y is 0≦y≦1)

$(1-x)Pb(Ga_{1/2}Nb_{1/2})O_3-xPb(Zr_{1-y}Ti_y)O_3$   Formula (3)

(where, x is 0.10<x<0.50, preferably 0.30<x<0.50, and y is 0≦y≦1)

$(1-x)Pb(Sc_{1/2}Ta_{1/2})O_3-xPb(Zr_{1-y}Ti_y)O_3$   Formula (4)

(where, x is 0.10<x<0.45, preferably 0.20<x<0.45, and y is 0≦y≦1)

$(1-x)Pb(Mg_{1/3}Nb_{2/3})O_3-xPb(Zr_{1-y}Ti_y)O_3$   Formula (5)

(where, x is 0.10<x<0.35, preferably 0.20<x<0.35, more preferably x=0.3, and y is 0≦y≦1)

$(1-x)Pb(Fe_{1/2}Nb_{1/2})O_3-xPb(Zr_{1-y}Ti_y)O_3$   Formula (6)

(where, x is 0.01<x<0.10, preferably 0.03<x<0.10, and y is 0≦y≦1)

$(1-x)Pb(Zn_{1/3}Nb_{2/3})O_3-xPb(Zr_{1-y}Ti_y)O_3$   Formula (7)

(where, x is 0.01<x<0.10, preferably 0.03<x<0.09, more preferably x=0.09, and y is 0≦y≦1)

$(1-x)Pb(Ni_{1/3}Nb_{2/3})O_3-xPb(Zr_{1-y}Ti_y)O_3$   Formula (8)

(where, x is 0.10<x<0.38, preferably 0.20<x<0.38, more preferably x=0.3, and y is 0≦y≦1)

$(1-x)Pb(Co_{1/2}W_{1/2})O_3-xPb(Zr_{1-y}Ti_y)O_3$   Formula (9)

(where, x is 0.10<x<0.42, preferably 0.20<x<0.42, and y is 0≦y≦1)

Further, as the relaxor material, for example, materials shown by the following formulae (1)-(9) can also be enumerated. One type or a plurality of types selected from among these materials is formed into a film by a liquid phase method or a vapor phase method, whereby the piezoelectric film 6 can be obtained.

$(1-x)Pb(Sc_{1/2}Nb_{1/2})O_3-xPbTiO_3$   Formula (1)

(where, x is 0.10<x<0.42, preferably 0.20<x<0.42)

$(1-x)Pb(In_{1/2}Nb_{1/2})O_3-xPbTiO_3$   Formula (2)

(where, x is 0.10<x<0.37, preferably 0.20<x<0.37)

$(1-x)Pb(Ga_{1/2}Nb_{1/2})O_3-xPbTiO_3$   Formula (3)

(where, x is 0.10<x<0.50, preferably 0.30<x<0.50)

$(1-x)Pb(Sc_{1/2}Ta_{1/2})O_3-xPbTiO_3$   Formula (4)

(where, x is 0.10<x<0.45, preferably 0.20<x<0.45)

$(1-x)Pb(Mg_{1/3}Nb_{2/3})O_3-xPbTiO_3$   Formula (5)

(where, x is 0.10<x<0.35, preferably 0.20<x<0.35, more preferably x=0.3)

$(1-x)Pb(Fe_{1/2}Nb_{1/2})O_3-xPbTiO_3$   Formula (6)

(where, x is 0.01<x<0.10, preferably 0.03<x<0.10)

$(1-x)Pb(Zn_{1/3}Nb_{2/3})O_3-xPbTiO_3$   Formula (7)

(where, x is 0.01<x<0.10, preferably 0.03<x<0.09, more preferably x=0.09)

$(1-x)Pb(Ni_{1/3}Nb_{2/3})O_3-xPbTiO_3$   Formula (8)

(where, x is 0.10<x<0.38, preferably 0.20<x<0.38, more preferably x=0.3)

$(1-x)Pb(Co_{1/2}W_{1/2})O_3-xPbTiO_3$   Formula (9)

(where, x is 0.10<x<0.42, preferably 0.20<x<0.42)

Figure 2A:
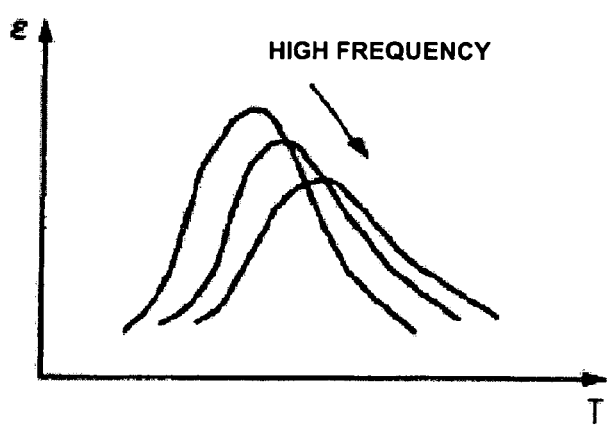
FIG. 2A is a graph for describing relaxor materials.
Figure 2B:
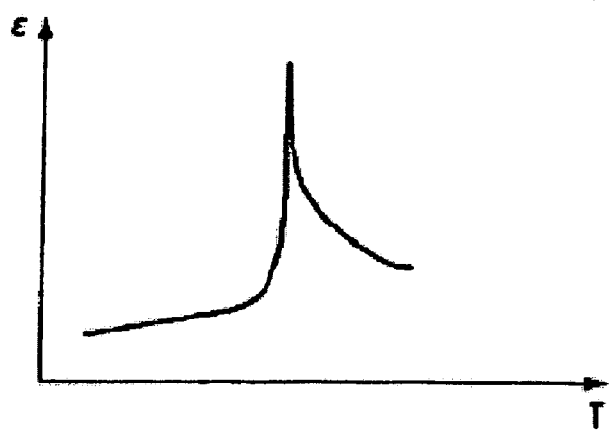
FIG. 2B is a graph for describing relaxor materials.

It is noted here that a relaxor material is a material whose temperature-dependence of dielectric constant exhibits a broad (wide) peak in bulk solid, as indicated in FIG. 2A, and in which the temperature at which its dielectric constant becomes maximum shifts according to frequencies measured. Also, a relaxor material is a material whose temperature dependence of piezoelectric constant exhibits a broad (wide) peak. In contrast, in a piezoelectric material such as Pb(Zr, Ti)O_3 (hereafter referred to as "PZT"), which is a non-relaxor material, its temperature dependence of dielectric constant and piezoelectric constant exhibit a very sharp peak as indicated in FIG. 2B. Accordingly, by using a relaxor material for the piezoelectric film 6, the piezoelectric element 1 obtained exhibits excellent piezoelectric characteristics in a broad temperature range, whereby its reliability becomes high and its characteristics become stable. However, when the film thickness of the relaxor material is about 100 nm-1 µm, it does not necessarily exhibit a defined peak shown in FIG. 2A. Some relaxor materials having a film thickness of about 100 nm-1 µm exhibit more gentle changes in the dielectric constant between room temperature and 100° C.

Moreover, the piezoelectric film 6 has a rhombohedral structure of a perovskite type, and is preferentially oriented to pseudo cubic (100), which is called as being coordinated in an engineered domain. Accordingly, the piezoelectric film 6 has a high piezoelectric constant ($d_{31}$). It is noted here that the case of "being preferentially oriented" can include a case in which all of the crystals are oriented to a desired orientation of pseudo cubic (100), or a case in which most of the crystals are oriented to a desired pseudo cubic (100) orientation, but the rest that is not oriented to pseudo cubic (100) is oriented to other orientations, as described above. In this manner, if most of the crystals are oriented to a desired pseudo cubic (100) orientation, when the barrier layer 8 is formed on the piezoelectric film 6, as described below, the barrier layer 8 succeeds the crystal structure of the piezoelectric film 6, and has the same crystal structure, in other words, is preferentially oriented to pseudo cubic (100).

The piezoelectric film 6 is formed on the buffer layer 5 that is similarly preferentially oriented, and thus has a crystal structure that succeeds the crystal structure of the buffer layer 5. Accordingly, the piezoelectric film 6 is preferentially oriented to pseudo cubic (100), like the buffer layer 5.

In the material that forms the piezoelectric film 6 (relaxor material), as for the aforementioned range of x indicating the composition ratio among the materials on the PbTiO_3 (hereafter also referred to as "PT") side, in particular, its upper limit is assumed to be a value at a morphotropic phase boundary (MPB). The morphotropic phase boundary is a value indicating a composition ratio of PbTiO_3 (PT) side at which a phase change takes place between rhombohedral structure and tetragonal structure. The value x is assumed to range from a value smaller than the composition ratio at the phase change to a value at which the phase becomes the rhombohedral structure.

It is noted here that the d constant ($d_{31}$), that is a piezoelectric constant, becomes to be the maximum value around the morphotropic phase boundary. Accordingly, as the lower limit value of the value x, a value close to the value x at the morphotropic phase boundary is selected. Therefore, although relatively small values are permissible in the range of x for achieving the present invention, values in the preferred range, in other words, values that are close to the value x at the morphotropic phase boundary, may be selected in order to obtain a higher d constant ($d_{31}$), i.e., higher piezoelectric constant.

The barrier layer 8 is formed of $Pb((Zr_{1-x}Ti_x)_{1-y}Nb_y)O_3$ (hereafter also referred to as "PZTN") of a perovskite type with a rhombohedral structure or a pseudo cubic structure, and is preferentially oriented to pseudo cubic (100). x is in a range of $0 \leq x \leq 1$, and y is in a range of $0.05 \leq y \leq 0.3$.

It can be noted here that the "pseudo cubic structure" includes, for example, a rhombohedral structure, a tetragonal structure, and a monoclinic structure, but does not include a complete cubic structure. The barrier layer 8 is formed into a film on the piezoelectric film 6 by a liquid phase method or a vapor phase method. The barrier layer 8 can be made preferentially oriented to pseudo cubic (100) by appropriately controlling, in particular, the temperature condition (heating condition) at the time of film formation. It is noted here that the case of "being preferentially oriented" can include a case in which all of the crystals are in a desired orientation that is a pseudo cubic (100) orientation, and a case where most of the crystals are in a desired orientation of pseudo cubic (100), and the remaining crystals that are not in a pseudo cubic (100) orientation are in other orientations.

The barrier layer 8 is formed on the piezoelectric film 6 that is similarly preferentially oriented, and thus has a crystal structure that succeeds the crystal structure of the piezoelectric film 6. Accordingly, the barrier layer 8 is preferentially oriented to pseudo cubic (100), like the piezoelectric film 6.

The barrier layer 8 may include silicon (Si), or silicon and germanium (Ge) by 5 mol % or less. Its detail will be described below in the section "Method for Manufacturing Piezoelectric Element."

Because the barrier layer 8 is formed of a piezoelectric material, it does not function as an electrode, and influences the piezoelectric characteristics (helps the piezoelectric characteristics) of the piezoelectric film 6 described above. Therefore, if the film thickness of the barrier layer 8 becomes too large, the influence on the piezoelectric characteristics of the piezoelectric film 6 becomes too large. Accordingly, the thickness of the barrier layer 8 may preferably be 100 nm or less, and more preferably, 50 nm or less, such that the influence does not grow more than necessary. Also, the barrier layer 8 may preferably have a film thickness that can securely exhibit the action and effect as a barrier layer to be described below. More specifically, the film thickness of the barrier layer 8 may preferably be 10 nm or greater.

The upper electrode 7 becomes the other electrode to apply a voltage to the piezoelectric film 6. The upper electrode 7 is formed of, for example, platinum (Pt), iridium (Ir), iridium oxide ($IrO_x$), titanium (Ti), $SrRuO_3$ or the like, like the lower electrode 4. The thickness of the upper electrode 7 may be about 100 nm.

It is noted that the use of a perovskite electrode such as a $SrRuO_3$ electrode as the lower electrode 4 does not deviate from the subject matter of the present invention. If the buffer layer 5 of PZTN is placed between the lower electrode 4 formed of $SrRuO_3$ and the piezoelectric film 6 formed of a relaxor material, the pseudo cubic (100) orientation of the piezoelectric film 6 can be more readily controlled in the manufacturing process.

It is noted that, in the example described above, the description is made as to the case where the piezoelectric element 1 is used as a head actuator for an ink jet recording head. However, the piezoelectric element 1 can be used as a piezoelectric actuator other than a head actuator for an ink jet recording head.

1-2. Method for Manufacturing Piezoelectric Element

Next, a method for manufacturing the piezoelectric element 1 in accordance with the present embodiment is described.

First, as a substrate 2, a single-crystal silicon substrate with a (110) or (100) orientation, a single-crystal silicon substrate with a (111) orientation, or a silicon substrate with a (100) or (110) orientation with an amorphous silicon oxide film that is a natural oxidation film formed thereon is prepared.

Figure 3A:
FIG. 3A is a view showing a step of manufacturing a piezoelectric element.

Next, an elastic film 3 is formed on the substrate 2 as shown in FIG. 3A. For the elastic film 3, a vapor phase method such as a CVD method, a sputter method, an evaporation method or the like is properly decided and adopted according to the material to be formed.

Figure 3B:
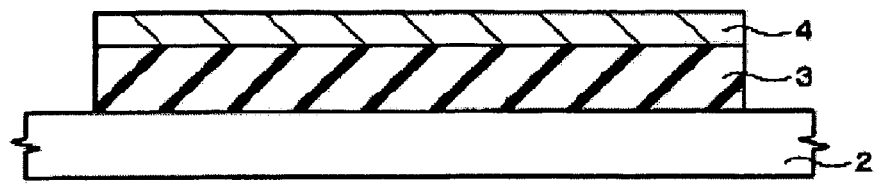
FIG. 3B is a view showing a step of manufacturing the piezoelectric element.

Next, a lower electrode 4 that is formed of platinum (Pt), for example, is formed on the elastic film 3, as shown in FIG. 3B. Platinum relatively readily becomes preferentially oriented to (111). Accordingly, it can be readily oriented and grown on the elastic film 3 by using, for example, a relatively simple method such as a sputter method or the like.

Figure 3C:
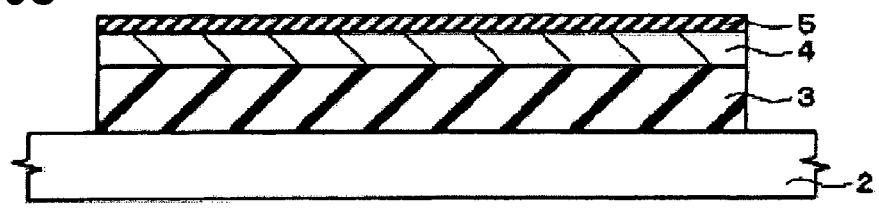
FIG. 3C is a view showing a step of manufacturing the piezoelectric element.

Next, a buffer layer 5 is formed on the lower electrode 4, as shown in FIG. 3C. More specifically, a precursor solution of $Pb((Zr_{1-x}Ti_x)_{1-y}Nb_y)O_3$ (hereafter also referred to as "PZTN") is disposed on the lower electrode 4 by a coating method, such as, a spin coat method, a droplet discharge method, or the like. Then, a heat-treatment such as sintering or the like is conducted to thereby obtain the buffer layer 5. More specifically, for example, the following is conducted.

A mixed solution (precursor solution) formed of first-third raw material liquids each containing at least one of Pb, Zr, Ti and Nb is prepared, and oxides contained in the mixed solution are crystallized by a thermal treatment or the like, whereby the buffer layer 5 is obtained.

The raw material solution that is the material for forming the buffer layer 5 is formed by mixing organic metals that include constituent metals of PZTN such that each of the metals becomes a desired molar ratio, and further dissolving or dispersing them by using an organic solvent such as alcohol. As the organic metals that contain constituent metals of PZTN, metal alkoxides and organic metals such as organic acid salts can be used. A variety of additives, such as, stabilization agent and the like may be added to this raw material solution if necessary. In addition, when hydrolysis or polycondensation is to be caused in the raw material solution, acid or base can be added to the raw material solution as a catalyst with an appropriate amount of water.

The first raw material liquid may be, for example, a solution in which a condensation polymer for forming $PbZrO_3$ perovskite crystal with Pb and Zr among the constituent metal elements of the PZTN ferroelectric film is dissolved in a solvent such as n-butanol in an anhydrous state.

The second raw material liquid may be, for example, a solution in which a condensation polymer for forming $PbTiO_3$ perovskite crystal with Pb and Ti among the constituent metal elements of the PZTN ferroelectric film is dissolved in a solvent such as n-butanol in an anhydrous state.

The third raw material liquid may be, for example, a solution in which a condensation polymer for forming $PbNbO_3$ perovskite crystal with Pb and Nb among the constituent metal elements of the PZTN ferroelectric film is dissolved in a solvent such as n-butanol in an anhydrous state.

The first, second and third raw material liquids are used, and the first, second and third raw material liquids are mixed in a desired ratio such that the buffer layer 5 has a desired composition ratio. The mixed solution is subject to a heat treatment or the like to cause crystallization, such that the buffer layer 5 can be formed.

Concretely, a series of steps including a mixed solution coating step, an alcohol removal step, a dry thermal treatment step, and a cleaning thermal treatment step is repeated a desired number of times, and then crystallization annealing is conducted to sinter the solution to form the buffer layer 5. Conditions in each of the steps are for example as follows.

In the mixed solution coating step, the mixed solution is coated by a coating method such as a spin coat method. First, the mixed solution is dripped on the lower electrode 4. In order to spread the dripped solution over the entire surface of the substrate, spinning is conducted. The rotation speed of the spinning may be, for example, about 500 rpm in an initial stage, and can be increased in succession to about 2000 rpm such that coating irregularities do not occur, and then the coating is completed.

In the dry thermal treatment step, a heat treatment (dry treatment) is performed in an air atmosphere, using a hot plate or the like, at temperatures that are about 10° C. higher than the boiling point of the solution used in the precursor solution, for example.

In the cleaning thermal treatment step, a heat treatment is performed in an air atmosphere, using a hot plate, at about 350° C.-400° C. to dissolve and remove ligands of the organic metals used in the precursor solution.

In crystallization annealing, in other words, in the sintering step for crystallization, a thermal treatment is performed in an oxygen atmosphere, at about 600° C., for example, by using the rapid thermal anneal (RTA) method or the like.

The film thickness of the buffer layer 5 after sintering can be about 10-100 nm, for example. The buffer layer 5 can also be formed by using, for example, a sputter method, a molecular beam epitaxial method, a laser ablation method, or the like.

When the buffer layer 5 is formed, a $PbSiO_3$ silicate may further preferably be added by, for example, 1-5 mol %. As a result, the crystallization energy of PZTN can be reduced. In other words, when PZTN is used as a material of the buffer layer 5, by adding Nb and $PbSiO_3$ silicate together, the crystallization temperature of the PZTN can be lowered. Concretely, a fourth raw material liquid, in addition to the first-third raw material liquids described above, can be used. As the fourth raw material liquid, a liquid in which a condensation polymer for forming $PbSiO_3$ crystal is dissolved in a solvent such as n-butanol in an anhydrous state can be enumerated. Also, germanate may also be used as an additive to promote crystallization. By adding $PbSiO_3$ silicate or germanate, when forming the buffer layer 5, the buffer layer 5 can include Si, or Si and Ge by 5 mol % or less.

In this manner, by forming the buffer layer 5 on the lower electrode 4 that is composed of platinum (Pt) with a (111) orientation, PZTN of a perovskite type having a rhombohedral structure or a pseudo cubic structure is formed in a state to be preferentially oriented to pseudo cubic (100).

Figure 3D:
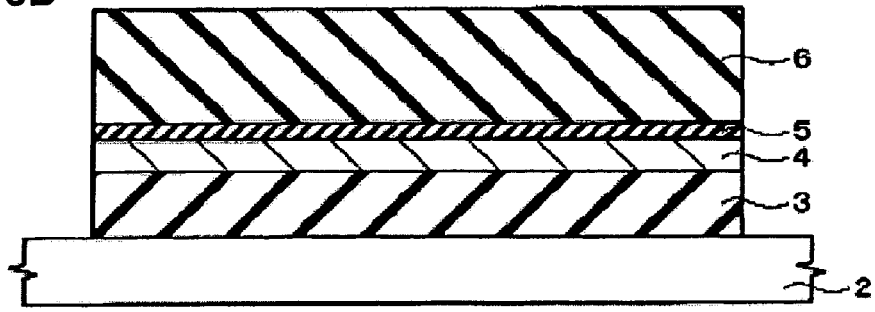
FIG. 3D is a view showing a step of manufacturing the piezoelectric element.

Next, a piezoelectric film 6 is formed on the buffer layer 5, as shown in FIG. 3D. More specifically, a precursor solution of a relaxor material is disposed on the buffer layer 5 by a well known coating method, such as, a spin coat method, a droplet discharge method, or the like. Then, a heat-treatment such as sintering or the like is conducted to thereby obtain the piezoelectric film 6.

Concretely, in a manner similar to the case of forming the buffer layer 5, a series of steps including a precursor solution coating step, a solution removal step, a dry thermal treatment step, and a cleaning thermal treatment step is repeated a desired number of times depending on the desired film thickness. Then, crystallization annealing is conducted to form the piezoelectric film 6. Conditions in each of the steps are generally the same as those in forming the buffer layer 5.

The piezoelectric film 6, as being formed on the buffer layer 5 that is preferentially oriented to (100), succeeds the crystal structure of the buffer layer 5, in other words, the orientation thereof, and would have the same crystal structure, in other words, preferentially oriented to pseudo cubic (100).

The precursor solution that is the forming material of the piezoelectric film 6 is formed as follows. Organic metals that include constituent metals of the relaxor material that becomes the piezoelectric film 6 are mixed such that each of the metals becomes a desired molar ratio, and they are dissolved or dispersed by using an organic solvent such as alcohol. As the organic metals that contain constituent metals of the relaxor materials, metal alkoxides and organic metals such as organic acid salts can be used. Concretely, for example, as carboxylic acid salt or acetylacetonato complex including the constituting metals of the relaxor material, the following can be enumerated as examples:

Lead acetate includes lead (Pb). Zirconium butoxide includes zirconium (Zr). Titanium isopropoxide includes titanium (Ti). Magnesium acetate includes magnesium (Mg). Niobium ethoxide includes niobium (Nb). Nickel acetylacetonato includes nickel (Ni). Scandium acetate includes scandium (Sc). Indium acetylacetonato includes indium (In). Zinc acetate includes zinc (Zn). Iron acetate includes iron (Fe). Gallium isopropoxide includes gallium (Ga). Tantalum ethoxide includes tantalum (Ta). Tungsten hexacarbonyl includes tungsten (W). It is noted that organic metals containing constituent metals of the relaxor material are not limited to those described above.

A variety of additives, such as, stabilization agent and the like may be added to this precursor solution if necessary. In addition, when hydrolysis or polycondensation is to be caused in the precursor solution, acid or base can be added to the precursor solution as a catalyst with an appropriate amount of water.

Figure 3E:
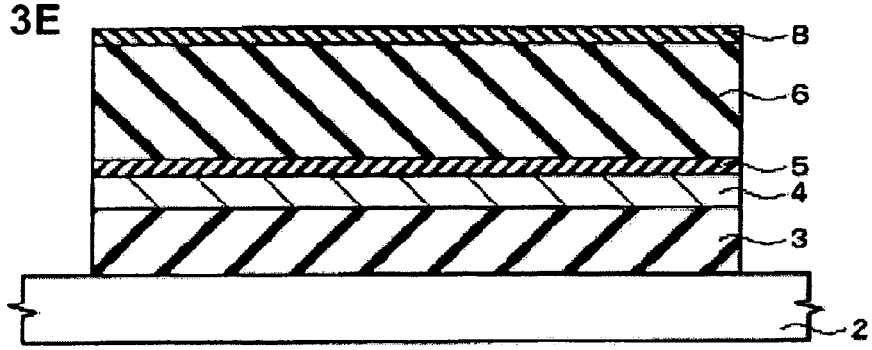
FIG. 3E is a view showing a step of manufacturing the piezoelectric element.

Next, a barrier layer 8 is formed on the piezoelectric film 6, as shown in FIG. 3E. More specifically, a precursor solution of $Pb((Zr_{1-x}Ti_x)_{1-y}Nb_y)O_3$ (hereafter also referred to as "PZTN") is disposed on the piezoelectric film 6 by a coating method, such as, a spin coat method, a droplet discharge method, or the like. Then, a heat-treatment such as sintering or the like is conducted to thereby obtain the barrier layer 8. More specifically, for example, the following is conducted.

A mixed solution (precursor solution) formed of first-third raw material liquids each containing at least one of Pb, Zr, Ti and Nb is prepared, and oxides contained in the mixed solution are crystallized by a thermal treatment or the like, whereby the barrier layer 8 is obtained.

The raw material solution that is the material for forming the barrier layer 8 is formed by mixing organic metals that include constituent metals of PZTN such that each of the metals becomes a desired molar ratio, and further dissolving or dispersing them by using an organic solvent such as alcohol. As the organic metals that contain constituent metals of PZTN, metal alkoxides and organic metals such as organic acid salts can be used. A variety of additives, such as, stabilization agent and the like may be added to this raw material solution if necessary. In addition, when hydrolysis or polycondensation is to be caused in the raw material solution, acid or base can be added to the raw material solution as a catalyst with an appropriate amount of water.

The first raw material liquid may be, for example, a solution in which a condensation polymer for forming $PbZrO_3$ perovskite crystal with Pb and Zr among the constituent metal elements of the PZTN ferroelectric film is dissolved in a solvent such as n-butanol in an anhydrous state.

The second raw material liquid may be, for example, a solution in which a condensation polymer for forming $PbTiO_3$ perovskite crystal with Pb and Ti among the constituent metal elements of the PZTN ferroelectric film is dissolved in a solvent such as n-butanol in an anhydrous state.

The third raw material liquid may be, for example, a solution in which a condensation polymer for forming $PbNbO_3$ perovskite crystal with Pb and Nb among the constituent metal elements of the PZTN ferroelectric film is dissolved in a solvent such as n-butanol in an anhydrous state.

The first, second and third raw material liquids are used, and the first, second and third raw material liquids are mixed in a desired ratio such that the barrier layer 8 has a desired composition ratio. The mixed solution is subject to a heat treatment or the like to cause crystallization, such that the barrier layer 8 can be formed.

Concretely, a series of steps including a mixed solution coating step, an alcohol removal step, a dry thermal treatment step, and a cleaning thermal treatment step is repeated a desired number of times, and then crystallization annealing is conducted to sinter the solution to form the barrier layer 8. Conditions in each of the steps are for example as follows.

In the mixed solution coating step, the mixed solution is coated by a coating method such as a spin coat method. First, the mixed solution is dripped on the piezoelectric film 6. In order to spread the dripped solution over the entire surface of the substrate, spinning is conducted. The rotation speed of the spinning may be, for example, about 500 rpm in an initial stage, and can be increased in succession to about 2000 rpm such that coating irregularities do not occur, and then the coating is completed.

In the dry thermal treatment step, a heat treatment (dry treatment) is performed in an air atmosphere, using a hot plate or the like, at temperatures that are about 10° C. higher than the boiling point of the solution used in the precursor solution, for example.

In the cleaning thermal treatment step, a heat treatment is performed in an air atmosphere, using a hot plate, at about 350° C.-400° C. to dissolve and remove ligands of the organic metals used in the precursor solution.

In crystallization annealing, in other words, in the sintering step for crystallization, a thermal treatment is performed in an oxygen atmosphere, at about 600° C., for example, by using the rapid thermal anneal (RTA) method or the like.

The film thickness of the barrier layer 8 after sintering can be about 10-100 nm, for example. The barrier layer 8 can also be formed by using, for example, a sputter method, a molecular beam epitaxial method, a laser ablation method, or the like.

When the barrier layer 8 is formed, a $PbSiO_3$ silicate may further preferably be added by, for example, 1-5 mol %. As a result, the crystallization energy of PZTN can be reduced. In other words, when PZTN is used as a material of the barrier layer 8, by adding Nb and $PbSiO_3$ silicate together, the crystallization temperature of the PZTN can be lowered. Concretely, a fourth raw material liquid, in addition to the first-third raw material liquids described above, can be used. As the fourth raw material liquid, a liquid in which a condensation polymer for forming $PbSiO_3$ crystal is dissolved in a solvent such as n-butanol in an anhydrous state can be enumerated. Also, germanate may also be used as an additive to promote crystallization. By adding $PbSiO_3$ silicate or germanate, when forming the barrier layer 8, the barrier layer 8 can include Si, or Si and Ge by 5 mol % or less.

In this manner, by forming the barrier layer 8 on the piezoelectric film 6 that is preferentially oriented to pseudo cubic (100), PZTN of a perovskite type having a rhombohedral structure or a pseudo cubic structure is formed in a state to be preferentially oriented to pseudo cubic (100).

It is noted that, in the present embodiment, examples in which the buffer layer 5, the piezoelectric film 6 and the barrier layer 8 are formed by a liquid phase method are described. However, the buffer layer 5, the piezoelectric film 6 and the barrier layer 8 can also be formed by using a vapor phase method such as a laser ablation method, a sputter method or the like.

Then, as shown in FIG. 3E, an upper electrode 7 formed of, for example, platinum (Pt) is formed on the barrier layer 8. The upper electrode 7 can be formed by a sputter method or the like, like the lower electrode 7.

By the steps described above, the piezoelectric element 1 in accordance with the present embodiment can be manufactured.

1-3. Action and Effect

Conventionally, a complex method was necessary when a piezoelectric film formed of a relaxor material of a perovskite type that has a rhombohedral structure and is preferentially oriented to pseudo cubic (100). Concretely, for example, the following is conducted.

First, a buffer layer is formed by using a laser ablation method, and also using a complex method such as an ion beam assisted method together. Then, a lower electrode of a perovskite type is formed on the buffer layer to thereby form a base. Then, a piezoelectric film is formed on the base. This complex method is used because of the following reasons.

The manufacturing margin for forming a dense thin film of a relaxor material on conventional electrode material such as platinum (Pt) and Iridium (Ir) is small. On the other hand, a dense thin film can be relatively easily obtained on an electrode of a perovskite type such as $SrRuO_3$ or the like. To control the orientation of an electrode of a perovskite type such as $SrRuO_3$ or the like, a laser ablation method and an ion beam assisted method are required. As a result, the method becomes complex. However, such a conventional method entails problems in that the processing steps are complex, which result in a higher cost, and the piezoelectric characteristics of piezoelectric films obtained are not sufficiently stable.

The piezoelectric element 1 in accordance with the present embodiment includes the buffer layer 5 that is formed of PZTN formed above the base substrate, and the piezoelectric film 6 that is formed of a relaxor material formed above the buffer layer 5. PZTN can be formed into a dense thin film on the Pt or Ir electrode with its orientation being controlled. Further, on the dense PZTN that is once formed, a relaxor material, such as, $(1-x)Pb(Mg_{1/3}Nb_{2/3})O_3-xPbTiO_3$ (hereafter also referred to as "PMN-PT") or the like, can be readily laminated as a dense thin film. Accordingly, in the piezoelectric element 1 in accordance with the present embodiment, the piezoelectric film 6 composed of a relaxor material is formed on the buffer layer 5 that is preferentially oriented to pseudo cubic (100), such that the piezoelectric film 6 is also preferentially oriented to pseudo cubic (100). Accordingly, the piezoelectric element 1 in accordance with the present embodiment can have the piezoelectric film 6 with excellent piezoelectric characteristics. In other words, the piezoelectric element 1 in accordance with the present embodiment has a high piezoelectric constant, and exhibits a larger deformation to a voltage applied.

Also, in the piezoelectric element 1 in accordance with the present embodiment, any of the relaxor materials shown by the above formulae can be used as the piezoelectric film 6. As a result, the piezoelectric element 1 in accordance with the present embodiment has a sufficiently high dielectric constant. Accordingly, the piezoelectric element 1 in accordance with the present embodiment, more specifically, the piezoelectric film 6 exhibits better deformations.

Also, the piezoelectric element 1 in accordance with the present embodiment has the buffer layer 5 and the barrier layer 8 composed of PZTN. If the buffer layer 5 and the barrier layer 8 are not provided, in other words, if the lower electrode and the piezoelectric film are in contact with each other, and the piezoelectric film and the upper electrode are in contact with each other, material deterioration may occur in interface sections between the lower electrode and the piezoelectric film, and in interface sections between the piezoelectric film and the upper electrode, due to lead (Pb) and oxygen vacancies in the piezoelectric films. Then, compositional shifts occur in the interface sections between the lower electrode and the piezoelectric film and in the interface sections between the piezoelectric film and the upper electrode, such that regions with a lower dielectric constant may be formed in the interface sections. As a result, a sufficient voltage may not be applied to the piezoelectric film.

In contrast, the piezoelectric element 1 in accordance with the present embodiment has the buffer layer 5 and the barrier layer 8 composed of PZTN. With the PZTN, diffusion of oxygen atoms stops in the depth of several tens nm in the lower electrode 4 and the upper electrode 7. In this manner, the diffusion of oxygen in the lower electrode 4 and the upper electrode 7 is extremely small. In other words, almost no diffusion of oxygen in the lower electrode 4 or the upper electrode 7 occurs, compared to the case where the buffer layer 5 and the barrier layer 8 are not provided. Also, in PZTN, almost all of the oxygen atoms are at lattice positions where they should originally be, and breakage of the crystal lattice that originates in vacancies of oxygen atoms is hardly present. In other words, most of oxygen included in PZTN can exist at the oxygen positions of the perovskite structure. This means that, not only oxygen that would most likely migrate, but also other elements such as Pb, Zr and Ti would be difficult to diffuse, and the film of PZTN itself has a barrier property, for example, a high oxygen barrier property.

Accordingly, in the piezoelectric element 1 in accordance with the present embodiment, regions with a lower dielectric constant may rarely be formed in the interface sections due to compositional shifts occurring in the interface sections between the lower electrode 4 and the buffer layer 5 composed of PZTN or in the interface sections between the barrier layer 8 composed of PZTN and the upper electrode 7. As a result, a sufficient voltage can be applied to the piezoelectric film 6.

Also, in accordance with the method for manufacturing the piezoelectric element 1 in accordance with the present embodiment, the piezoelectric film 6 can be readily formed by a liquid phase method whose process is easier than a vapor phase method.

1-4. Experimental Example

A piezoelectric element 1 was fabricated as follows based on the method for manufacturing a piezoelectric element described above.

First, a lower electrode 4 formed of platinum (Pt) with a (111) orientation was formed over a substrate 2 through an elastic film 3 by a sputter method. The lower electrode 4 had a film thickness of 200 nm. The electrical power at the time of sputtering was 200 W.

Next, a precursor solution of Pb $(Zr_{0.6}Ti_{0.2}Nb_{0.2})O_3$ (hereafter also referred to as "PZTN") was prepared as follows.

A mixed solution composed of first-third raw material liquid containing at least Pb, Zr, Ti and Nb was prepared.

As the first raw material liquid, a solution in which a condensation polymer for forming $PbZrO_3$ perovskite crystal with Pb and Zr among the constituent metal elements of the PZTN ferroelectric film was dissolved in a solvent of n-butanol in an anhydrous state was used.

As the second raw material liquid, a solution in which a condensation polymer for forming $PbTiO_3$ perovskite crystal with Pb and Ti among the constituent metal elements of the PZTN ferroelectric film was dissolved in a solvent of n-butanol in an anhydrous state was used.

As the third raw material liquid, a solution in which a condensation polymer for forming $PbNbO_3$ perovskite crystal with Pb and Nb among the constituent metal elements of the PZTN ferroelectric film was dissolved in a solvent of n-butanol in an anhydrous state was used.

When the buffer layer 5 was formed, a $PbSiO_3$ silicate was further added by 2 mol %. Concretely, a fourth raw material liquid, in addition to the first-third raw material liquids described above, was used. As the fourth raw material liquid, a liquid in which a condensation polymer for forming $PbSiO_3$ crystal is dissolved in a solvent of n-butanol in an anhydrous state was used.

The first-forth raw material liquids were used, and the first-forth raw material liquids were mixed in a desired ratio such that the buffer layer 5 had a desired composition ratio. Then, a series of steps including a mixed solution coating step, an alcohol removal step, a dry thermal treatment step, and a cleaning thermal treatment step was repeated a desired number of times, and then crystallization annealing was conducted to sinter the solution to form the buffer layer 5.

In the mixed solution coating step, the mixed solution was coated by a spin coat method. First, the mixed solution was dripped on the lower electrode 4. In order to spread the dripped solution over the entire surface of the substrate, spinning was conducted. The rotation speed of the spinning was about 500 rpm in an initial stage, and increased in succession to about 2000 rpm such that coating irregularities would not occur, and then the coating was completed. In the dry thermal treatment step, a heat treatment (dry treatment) was performed in an air atmosphere, using a hot plate or the like, at a temperature that was about 10° C. higher than the boiling point of the solution used in the precursor solution, for example. In the cleaning thermal treatment step, a heat treatment was performed in an air atmosphere, using a hot plate, at about 400° C. to dissolve and remove ligands of the organic metals used in the precursor solution. In crystallization annealing, in other words, in the sintering step for crystallization, a thermal treatment was performed in an oxygen atmosphere, at about 600° C., by using the rapid thermal anneal (RTA) method or the like. The film thickness of the buffer layer 5 after sintering was 20 nm.

In this manner, by forming the buffer layer 5 on the lower electrode 4 composed of platinum (Pt) with a (111) orientation, PZTN of a perovskite type having a rhombohedral structure or a pseudo cubic structure was formed in a state to be preferentially oriented to pseudo cubic (100).

Then, a precursor solution of $(1-x)Pb(Mg_{1/3}Nb_{2/3})O_3-xPbTiO_3$ (hereafter also referred to as "PMN-PT") was prepared as follows.

First, metal reagents of lead acetate, titanium isopropoxide, magnesium acetate, and niobium ethoxide were prepared. Then, they were mixed to become a mole ratio corresponding to the PMN-PT to be formed, and dissolved (dispersed) in butyl cellosolve. Further, diethanolamine was added in the solution as a stabilizing agent for the solution. In this manner, the precursor solution was adjusted. It is noted that acetic acid may be used instead of diethanolamine.

Then, the precursor solution was coated on the buffer layer 5 by a spin coat method (precursor solution coating step). Next, a thermal treatment (dry treatment) was then performed at a temperature that was about 10° C. higher than the boiling point of the solvent (about 170° C. in the case of butyl cellosolve) to thereby remove the solvent to cause gelation (dry thermal treatment step). Then, a heat treatment was conducted at about 350° C. to dissolve and remove organic components other than the solvent remaining in the film (cleaning thermal treatment step), thereby forming an amorphous film. Then, a rapid thermal annealing (RTA) was performed in an oxygen atmosphere to heat at about 600° C., thereby causing crystallization to form the piezoelectric film 6. The film thickness of the piezoelectric film 6 was 500 nm.

Next, a precursor solution of $Pb(Zr_{0.6}Ti_{0.2}Nb_{0.2})O_3$ (hereafter also referred to as "PZTN") was prepared as follows.

A mixed solution composed of first-third raw material liquid containing at least Pb, Zr, Ti and Nb was prepared.

As the first raw material liquid, a solution in which a condensation polymer for forming $PbZrO_3$ perovskite crystal with Pb and Zr among the constituent metal elements of the PZTN ferroelectric film was dissolved in a solvent of n-butanol in an anhydrous state was used.

As the second raw material liquid, a solution in which a condensation polymer for forming $PbTiO_3$ perovskite crystal with Pb and Ti among the constituent metal elements of the PZTN ferroelectric film was dissolved in a solvent of n-butanol in an anhydrous state was used.

As the third raw material liquid, a solution in which a condensation polymer for forming $PbNbO_3$ perovskite crystal with Pb and Nb among the constituent metal elements of the PZTN ferroelectric film was dissolved in a solvent of n-butanol in an anhydrous state was used.

When the barrier layer 8 was formed, a $PbSiO_3$ silicate was further added by 2 mol %. Concretely, a fourth raw material liquid, in addition to the first-third raw material liquids described above, was used. As the fourth raw material liquid, a liquid in which a condensation polymer for forming $PbSiO_3$ crystal is dissolved in a solvent of n-butanol in an anhydrous state was used.

The first-forth raw material liquids were used, and the first-forth raw material liquids were mixed in a desired ratio such that the barrier layer 8 had a desired composition ratio. Then, a series of steps including a mixed solution coating step, an alcohol removal step, a dry thermal treatment step, and a cleaning thermal treatment step was repeated a desired number of times, and then crystallization annealing was conducted to sinter the solution to form the barrier layer 8.

In the mixed solution coating step, the mixed solution was coated by a spin coat method. First, the mixed solution was dripped on the piezoelectric film 6. In order to spread the dripped solution over the entire surface of the substrate, spinning was conducted. The rotation speed of the spinning was about 500 rpm in an initial stage, and increased in succession to about 2000 rpm such that coating irregularities would not occur, and then the coating was completed. In the dry thermal treatment step, a heat treatment (dry treatment) was performed in an air atmosphere, using a hot plate or the like, at a temperature that was about 10° C. higher than the boiling point of the solution used in the precursor solution, for example. In the cleaning thermal treatment step, a heat treatment was performed in an air atmosphere, using a hot plate, at about 400° C. to dissolve and remove ligands of the organic metals used in the precursor solution. In crystallization annealing, in other words, in the sintering step for crystallization, a thermal treatment was performed in an oxygen atmosphere, at about 600° C., by using the rapid thermal anneal (RTA) method or the like. The film thickness of the barrier layer 8 after sintering was 20 nm.

In this manner, by forming the barrier layer 8 on the piezoelectric film 6 that is preferentially oriented to pseudo cubic (100), PZTN of a perovskite type having a rhombohedral structure or a pseudo cubic structure was formed in a state to be preferentially oriented to pseudo cubic (100).

Then, an upper electrode 7 formed of platinum (Pt) was formed on the barrier layer 8 by a sputter method, whereby the piezoelectric element 1 was obtained.

The piezoelectric film 6 in the piezoelectric element 1 thus obtained was examined by X-ray diffraction (XRD), and it was confirmed that it was preferentially oriented to pseudo cubic (100), and it was further confirmed that it had a rhombohedral structure.

Moreover, the piezoelectric constant ($d_{31}$) of the piezoelectric film 6 was measured, and it was 400 pC/N. Also, the leakage current was less than $10^{-6}$ A/cm$^2$ at 100 kV/cm. Further, the repetition durability of the piezoelectric element 1 was examined when 300 kV/cm was applied, and it was found to be equipped with a durability that can ensure $5 \times 10^{10}$ repetitions.

It is noted here that the buffer layer 5 may be composed of a plurality of layers. For example, $PbTiO_3$ may be deposited in layer only to a thickness of 5 nm on the platinum (Pt) electrode for the purpose of improving the pseudo cubic (100) orientation of an uppermost surface of the buffer layer 5. This is because PZTN of Ti-rich composition that can readily assume a tetragonal structure can more readily have a pseudo cubic (100) preferential orientation. The film thickness can be more readily controlled in laminating the $PbTiO_3$ when a sputter method is used rather than a solution coating method. Then, a precursor solution of $Pb(Zr_{0.6}Ti_{0.2}Nb_{0.2})O_3$ is coated to a thickness of 20 nm. PZTN in this composition range (Zr:Ti:Nb=0.6:0.2:0.2) would likely have a rhombohedral structure, and would likely be preferentially oriented to pseudo cubic (100)

immediately on the PZTN having a tetragonal structure with a pseudo cubic (100) orientation.

It is noted that piezoelectric films 6 were made by using relaxor materials shown in Table 1 below, and their piezoelectric constants ($d_{31}$) were examined. All of them exhibited high piezoelectric characteristics in which $d_{31}$ was greater than 400 pC/N. The piezoelectric constants were measured as follows.

First, a displacement magnitude S of the piezoelectric at the actual cavity at the time of voltage application is measured by using a laser displacement gauge. This value S is compared with a displacement magnitude S' that is obtained by a simulation of piezoelectric displacement by a finite element method, such that a piezoelectric constant ($d_{31}$) of a piezoelectric film assumed in the finite element method can be appropriated. It is noted that physical amounts that are necessary for the piezoelectric displacement simulation by the finite element method are Young's modulus and film stress of each of the films, and the piezoelectric constant ($d_{31}$) of the piezoelectric film.

Also, in the composition of the relaxor material, $Pb(Zr_{1-y}Ti_y)O_3$ may be used instead of $PbTiO_3$. Also, the value of y may preferably be $0.7 \leq y \leq 1$.

TABLE 1

| Relaxor material | Piezoelectric constant $d_{31}$ (pC/N) |
| --- | --- |
| $0.58Pb\ (Sc_{1/2}Nb_{1/2})\ O_3\text{-}0.42PbTiO_3$ | 500 |
| $0.63Pb\ (In_{1/2}Nb_{1/2})\ O_3\text{-}0.37PbTiO_3$ | 400 |
| $0.50Pb\ (Ga_{1/2}Nb_{1/2})\ O_3\text{-}0.50PbTiO_3$ | 400 |
| $0.55Pb\ (Sc_{1/2}Ta_{1/2})\ O_3\text{-}0.45PbTiO_3$ | 400 |
| $0.65Pb\ (Mg_{1/3}Nb_{2/3})\ O_3\text{-}0.35PbTiO_3$ | 600 |
| $0.90Pb\ (Fe_{1/2}Nb_{1/2})\ O_3\text{-}0.10PbTiO_3$ | 400 |
| $0.91Pb\ (Zn_{1/3}Nb_{2/3})\ O_3\text{-}0.09PbTiO_3$ | 600 |
| $0.62Pb\ (Ni_{1/3}Nb_{2/3})\ O_3\text{-}0.38PbTiO_3$ | 500 |
| $0.58Pb\ (Co_{1/2}W_{1/2})\ O_3\text{-}0.42PbTiO_3$ | 400 |

2-1. Ink Jet Recording Head

Figure 4:
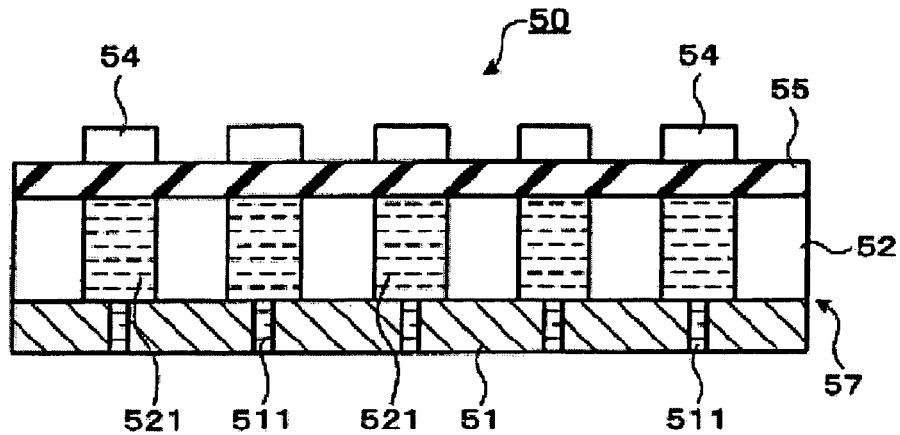
FIG. 4 is a view schematically showing a structure of an ink jet recording head.
Figure 5:
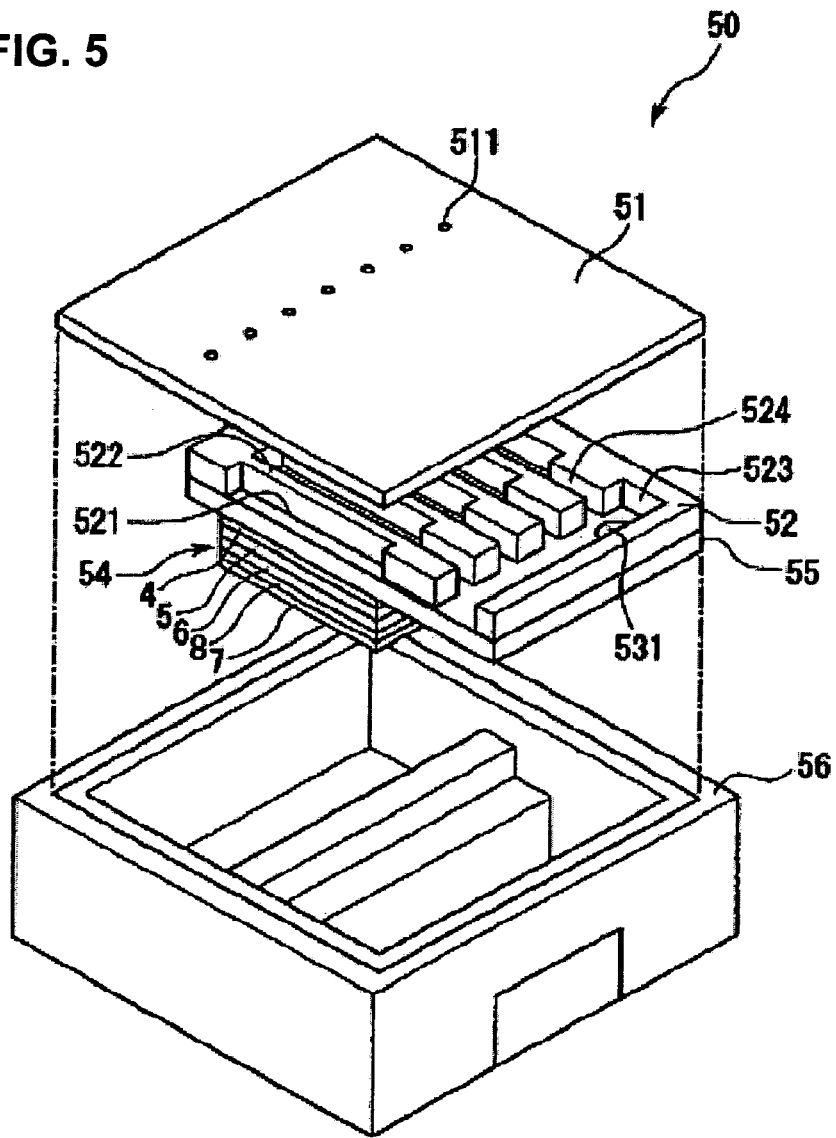
FIG. 5 is an exploded perspective view of the ink jet recording head.

Next, an ink jet recording head using the piezoelectric element shown in FIG. 1 is described. FIG. 4 is a side cross-sectional view schematically showing a structure of an ink jet recording head using the piezoelectric element shown in FIG. 1. FIG. 5 is an exploded perspective view of the ink jet recording head. It is noted that FIG. 5 shows the head upside down with respect to a state in which it is normally used.

The ink jet recording head (hereafter also referred to as the "head") 50 is equipped with a head main body 57 and piezoelectric elements 54 provided above the head main body 57, as shown in FIG. 4. It is noted that the piezoelectric element 54 shown in FIG. 4 is composed of the lower electrode 4, the buffer layer 5, the piezoelectric film 6, the barrier layer 8 and the upper electrode 7 of the piezoelectric element 1 shown in FIG. 1 (see FIG. 5). Also, the elastic film 3 in the piezoelectric layer 1 shown in FIG. 1 corresponds to an elastic plate 55 in FIG. 4. Also, the substrate 2 (see FIG. 1) composes a main portion of the head main body 57 as described below.

More specifically, the head 50 is equipped with a nozzle plate 51, an ink chamber substrate 52, an elastic plate 55, and piezoelectric elements (vibration sources) 54 that are bonded to the elastic plate 55, which are housed in a base substrate 56, as shown in FIG. 5. The head 50 forms an on-demand type piezoelectric jet head.

The nozzle plate 51 is formed from, for example, a rolled plate of stainless steel or the like, and includes multiple nozzles 511 formed in a row for jetting ink droplets. The pitch of the nozzles 511 may be appropriately set according to the printing resolution.

The ink chamber substrate 52 is fixedly bonded (affixed) to the nozzle plate 51. The ink chamber substrate 52 is formed with the substrate 2 described above. The ink chamber substrate 52 has a plurality of cavities (ink cavities) 521, a reservoir 523, and supply ports 524, which are defined by the nozzle plate 51, side walls (partition walls) 522 and the elastic plate 55 to be described below. The reservoir 523 temporarily reserves ink that is supplied from an ink cartridge 631 (see FIG. 8). The ink is supplied from the reservoir 523 to the respective cavities 521 through the supply ports 524.

Figure 6A:
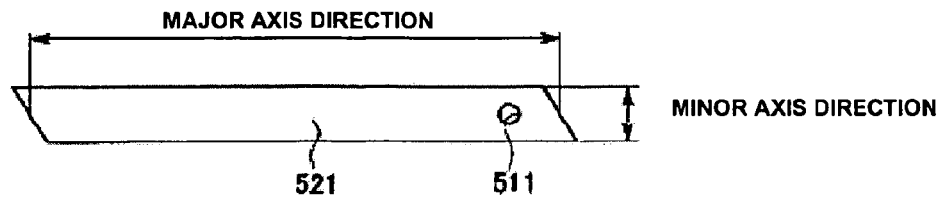
FIG. 6A is a plan view of a cavity.
Figure 6B:
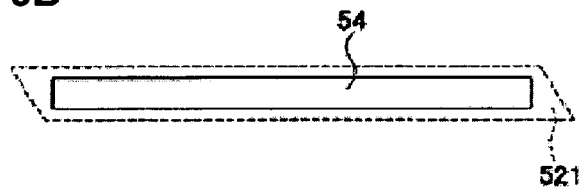
FIG. 6B is a plan view of a piezoelectric element.

Each of the cavities 521 is formed in a strip-like shape. The plane configuration of the cavity 521 is a rectangle having a major axis and a minor axis (parallelogram), as shown in FIG. 6A and FIG. 6B. Typical measurements of the major axis and the minor axis of the cavity 521 are 2 mm and 60 μm, respectively. The cavity 521 is disposed for each of the corresponding nozzles 511 as shown in FIG. 4 and FIG. 5. The cavity 521 has a volume that is variable by vibrations of the elastic plate 55 to be described below. The cavity 521 is formed to eject ink by the volume change.

As a base material for obtaining the ink chamber substrate 52, in other words, as the substrate 2 described above, for example, a silicon single-crystal substrate (Si substrate) with a (110) orientation is used. Because the silicon single-crystal substrate with a (110) orientation is suitable for anisotropic etching, the ink chamber substrate 52 can be readily and securely formed. It is noted that this silicon single-crystal substrate is used with its surface where the elastic film 3 shown in FIG. 1 is formed, in other words, with its surface where the elastic plate 55 is formed, being a (100) plane.

The average thickness of the ink chamber substrate 52, i.e., the thickness including the cavity 521, is not particularly limited, but may preferably be about 10-1000 μm, and more preferably, about 100-500 μm. Also, the volume of the cavity 521 is not particularly limited, but may preferably be about 0.1-100 nL, and more preferably, about 0.1-10 nL.

The elastic plate 55 is disposed on the ink chamber substrate 52 on the opposite side of the nozzle plate 51, and a plurality of piezoelectric elements 54 are provided on the elastic plate 55 on the opposite side of the ink chamber substrate 52. The elastic plate 55 is formed with the elastic film 3 of the piezoelectric element 1 shown in FIG. 1 described above. A communication hole 531 that penetrates the elastic plate 55 in its thickness direction is formed in the elastic plate 55 at a predetermined position. Ink is supplied from an ink cartridge 631 to be described below to the reservoir 523 through the communication hole 531.

Each of the piezoelectric elements 54 is structured with the piezoelectric film 6 interposed between the lower electrode 4 and the upper electrode 7, as described above. Each of the piezoelectric elements 54 is disposed in a position corresponding generally to a center portion of each of the cavities 521, and has a rectangular shape as viewed in a plan view, as shown in FIG. 6B. Each of the piezoelectric elements 54 is electrically connected to a piezoelectric element driving circuit to be described below, and is structured to operate (vibrate, deform) based on signals of the piezoelectric element driving circuit. In other words, each of the piezoelectric elements 54 functions as a vibration source (head actuator). The elastic plate 55 vibrates (deforms) by vibration (deformation) of the piezoelectric element 54, and functions to instantaneously increase the inner pressure of the cavity 521.

The base substrate 56 is formed of, for example, any one of various resin materials, any one of metal materials, or the like. The ink chamber substrate 52 is affixed to and supported by the base substrate 56, as shown in FIG. 5.

2-2. Operation of Ink Jet Recording Head

Next, operations of the ink jet recording head 50 in accordance with the present embodiment are described.

Figure 7A:
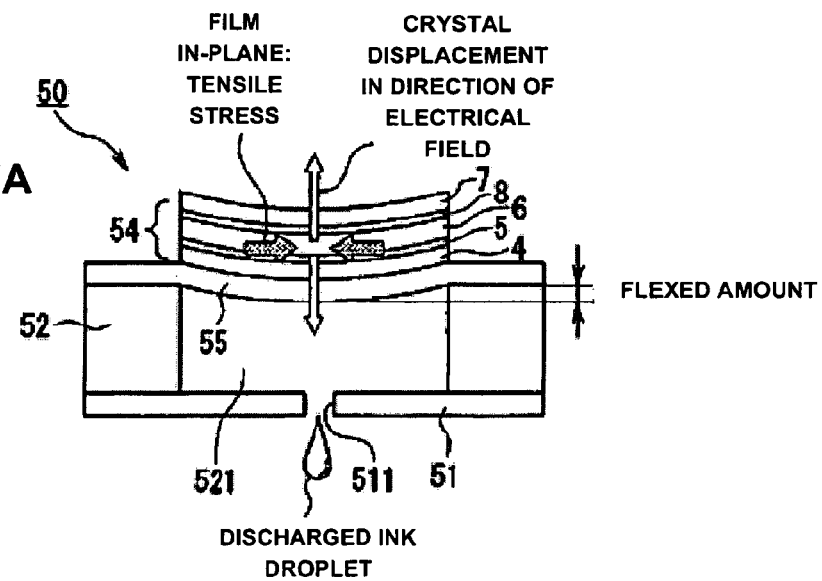
FIG. 7A is a view for describing operations of the head.
Figure 7B:
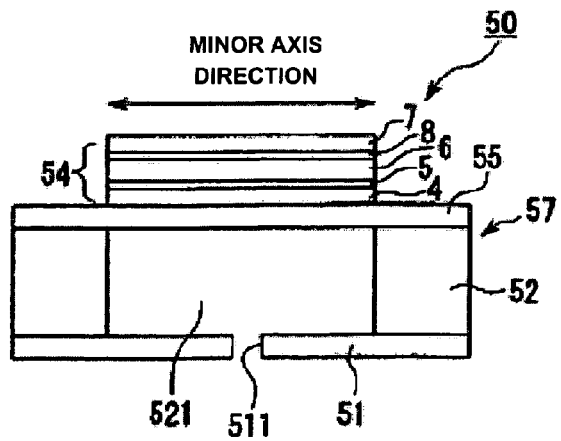
FIG. 7B is a view for describing operations of the head.

In the head 50 in accordance with the present embodiment, in a state in which a predetermined jetting signal is not inputted through the piezoelectric element driving circuit, in other words, in a state in which no voltage is applied across the lower electrode 4 and the upper electrode 6 of the piezoelectric element 54, no deformation occurs in the piezoelectric film 6, as shown in FIG. 7B. For this reason, no deformation occurs in the elastic plate 55, and no volume change occurs in the cavity 521. Accordingly, no ink droplet is discharged from the nozzle 511.

On the other hand, in a state in which a predetermined jetting signal is inputted through the piezoelectric element driving circuit, in other words, in a state in which a predetermined voltage (for example, about 30V) is applied across the lower electrode 4 and the upper electrode 6 of the piezoelectric element 54, a deflection deformation occurs in the piezoelectric film 6 in its minor axis direction, as shown in FIG. 7A. By this, the elastic plate 53 flexes by, for example, about 500 nm, thereby causing a change in the volume of the cavity 521. At this moment, the pressure within the cavity 521 instantaneously increases, and an ink droplet is discharged from the nozzle 511.

In other words, when the voltage is impressed, the crystal lattice of the piezoelectric film 6 is extended in a direction perpendicular to its surface, but at the same time compressed in a direction parallel with the surface.

In this state, a tensile stress works in-plane in the piezoelectric film 6. Therefore, this stress bends and flexes the elastic plate 55. The larger the amount of displacement (in an absolute value) of the piezoelectric film 6 in the direction of the minor axis of the cavity 521, the more the amount of flex of the elastic plate 55 becomes, and the more effectively an ink droplet can be discharged. In the present embodiment, the piezoelectric constant ($d_{31}$) of the piezoelectric film 6 of the piezoelectric element 54 (piezoelectric element 1) is high, as described above, and a greater deformation is generated to an impressed voltage. Accordingly, the amount of deflection of the elastic plate 55 can become large, and the ink droplet can be discharged more efficiently.

It is noted here that the term "efficiently" implies that an ink droplet in the same amount can be jetted by a smaller voltage. In other words, the driving circuit can be simplified, and at the same time, the power consumption can be reduced, such that the nozzles 511 can be formed at a pitch with a higher density. Alternatively, the length of the major axis of the cavity 521 can be shortened, such that the entire head can be miniaturized.

When one ejection of the ink is completed, the piezoelectric element driving circuit stops application of the voltage across the lower electrode 4 and the upper electrode 7. By this, the piezoelectric element 54 returns to its original shape shown in FIG. 7B, and the volume of the cavity 521 increases. It is noted that, at this moment, a pressure (pressure in a positive direction) works on the ink in a direction from the ink cartridge 631 to be described below toward the nozzle 511. For this reason, air is prevented from entering the ink chamber 521 from the nozzle 511, and an amount of ink matching with the jetting amount of ink is supplied from the ink cartridge 631 through the reservoir 523 to the cavity 521.

In this manner, by inputting jetting signals successively through the piezoelectric element driving circuit to the piezoelectric elements 54 at positions where ink droplets are to be jetted, arbitrary (desired) characters and figures can be printed.

2-3. Method for Manufacturing Ink Jet Recording Head

Next, an example of a method for manufacturing the ink jet recording head 50 in accordance with the present embodiment is described.

First, a base material that becomes an ink chamber substrate 52, in other words, a substrate 2 formed of a silicon single-crystal substrate (Si substrate) with a (110) orientation, is prepared. Then, an elastic film 3 is formed on the substrate 2 as shown in FIG. 3A-FIG. 3E. Then, a lower electrode 4, a buffer layer 5, a piezoelectric film 6, a barrier layer 8 and an upper electrode 7 are successively formed over the elastic film 3. It is noted that the elastic film 3 formed here becomes the elastic plate 55, as described above.

Next, the upper electrode 7, the barrier layer 8, the piezoelectric film 6, the buffer layer 5, and the lower electrode 4 are patterned in a manner to correspond to individual cavities 521, as shown in FIG. 7A and FIG. 7B, thereby forming piezoelectric elements 54 in the number corresponding to the number of the cavities 521, as shown in FIG. 4.

Next, the base material (substrate 2) that becomes an ink chamber plate 52 is processed (patterned), thereby forming concave sections that become the cavities 521 at positions corresponding to the piezoelectric elements 54, and concave sections that become a reservoir 523 and supply ports 524 at predetermined positions.

More specifically, a mask layer that matches with the positions of the ink cavities 521, the reservoir 523 and the supply ports 524 is formed. Then, a dry etching, such as, for example, a parallel flat plate reactive ion etching method, an inductive coupled plasma method, an electron cyclotron resonance method, a helicon wave excitation method, a magnetron method, a plasma etching method, an ion beam etching method, or the like, or a wet etching with a highly concentrated alkaline solution in an amount of about 5 to 40 wt % of potassium hydroxide, tetramethylammonium hydroxide or the like, is conducted.

In accordance with the present embodiment, a silicon substrate with a (110) orientation is used as the base material (substrate 2), a wet etching (anisotropic etching) using a highly concentrated alkaline solution is preferably used. In the case of wet etching with a highly concentrated alkaline solution, the elastic film 3 can function as an etching stopper, as described above. Therefore the ink chamber plate 52 can be more readily formed.

In this manner, the base material (substrate 2) is removed by etching in its thickness direction to the extent that the elastic plate 55 (elastic film 3) is exposed, thereby forming the ink chamber substrate 52. It is noted that, in this instance, portions that remain without being etched become side walls 522. The elastic film 3 (elastic plate 55) exposed can assume a state that can function as the elastic plate 55.

Next, a nozzle plate 51 formed with a plurality of nozzles 511 is bonded such that each of the nozzles 511 is aligned to correspond to each of the concave sections that become the respective cavities 521. By this, the plurality of cavities 521, the reservoir 523 and the plurality of supply ports 524 are formed. For bonding of the nozzle plate 51, for example, a bonding method using adhesive, a fusing method, or the like can be used. Next, the ink chamber substrate 52 is attached to the base substrate 56.

By the process described above, the ink jet recording head 50 in accordance with the present embodiment can be manufactured.

In the inkjet recording head 50 in accordance with the present embodiment, an efficient ink discharge is possible because the piezoelectric elements 54 (piezoelectric elements 1) have excellent piezoelectric characteristics, such that the nozzles 511 can be arranged in a higher density. Accordingly, a high density printing and a high-speed printing become possible. Furthermore, a further miniaturization of the entire head can be achieved.

3-1. Ink Jet Printer

Next, an ink jet printer equipped with the aforementioned ink jet recording head 50 is described. It is noted that the ink jet printer in the present invention includes those for printing on paper or the like, as well as droplet discharge devices for industrial use.

Figure 8:
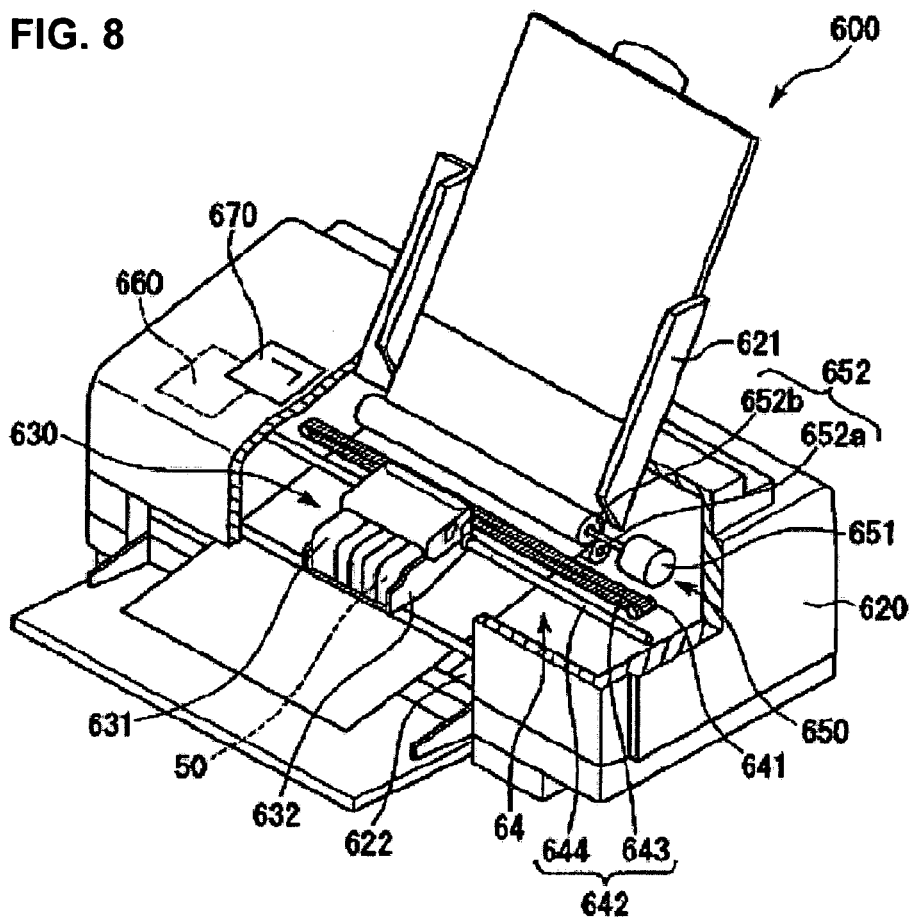
FIG. 8 is a view schematically showing a structure of an ink jet recording in accordance with an embodiment.

FIG. 8 is a view schematically showing a structure of an embodiment in which an ink jet printer 600 of the present invention is applied to an ordinary printer for printing on paper or the like. It is noted that, an upper side in FIG. 8 refers to an "upper section" and a lower side therein refers to a "lower section" in the following descriptions.

The ink jet printer 600 is equipped with an apparatus main body 620, in which a tray 621 for holding recording paper P in an upper rear section thereof, a discharge port 622 for discharging the recording paper P to a lower front section thereof, and an operation panel 670 on an upper surface thereof are provided.

The operation panel 670 is formed from, for example, a liquid crystal display, an organic EL display or an LED lamp, and is equipped with a display section (not shown) for displaying error messages and the like, and an operation section (not shown) composed of various switches and the like.

Also, the apparatus main body 620 is provided on its inside mainly with a printing device 640 having a head unit 630 that can reciprocate, a paper feeding device 650 for feeding recording paper P one by one into the printing device 640, and a control section 660 for controlling the printing device 640 and the paper feeding device 650.

By the control of the control section 660, the paper feeding device 650 intermittently feeds the recording paper P one by one. The recording paper P intermittently fed passes near a lower section of the head unit 630. In this moment, the head unit 630 reciprocally moves in a direction generally perpendicular to a feeding direction of the recording paper P, and prints on the recording paper P. In other words, the reciprocal movements of the head unit 630 and the intermittent feeding of the recording paper P define a main scanning and an auxiliary scanning, respectively, thereby performing printing by an ink jet method.

The printing device 640 is equipped with the head unit 630, a carriage motor 641 that is a driving source for the head unit 630, and a reciprocating mechanism 642 that receives rotations of the carriage motor 641 to reciprocate the head unit 630.

The head unit 630 includes the ink jet recording head 50 equipped with multiple nozzles 511 in its lower section, ink cartridges 631 that supply inks to the ink jet recording head 50, and a carriage 632 on which the ink jet recording head 50 and the ink cartridges 631 are mounted.

It is noted that the ink cartridges 631 that are filled with four colors of yellow, cyan, magenta and black may be used, to enable full-color printing. In this case, the head unit 630 may be provided with the ink jet recording heads 50 corresponding to the respective colors.

The reciprocating mechanism 642 includes a carriage guide shaft 643 having both ends thereof supported by a frame (not shown), and a timing belt 644 that extends in parallel with the carriage guide shaft 643. The carriage 632 is freely reciprocally supported by the carriage guide shaft 643, and affixed to a portion of the timing belt 644. By operations of the carriage motor 641, the timing belt 644 is moved in a positive or reverse direction through pulleys, and the head unit 630 reciprocally moves, guided by the carriage guide shaft 643. During these reciprocal movements, the ink is jetted from the ink jet recording head 50, to print on the recording paper P.

The paper feeding device 650 includes a paper feeding motor 651 as its driving source and a paper feeding roller 652 that is rotated by operations of the paper feeding motor 651. The paper feeding roller 652 is composed of a follower roller 652*a* and a driving roller 652*b* that are disposed up and down and opposite each other with a feeding path of the recording paper P (i.e., the recording paper P) being interposed between the two, and the driving roller 652*b* is coupled to the paper feeding motor 651. With such a structure, the paper feeding roller 652 can feed the multiple recording papers P disposed in the tray 621 one by one, toward the printing device 640. It is noted that, instead of the tray 621, a paper feeding cassette for storing recording paper P may be mounted in a freely detachable manner.

The control section 660 is provided for printing by controlling the printing device 640, the paper feeding device 650 and the like, based on print data inputted from a personal computer, a host computer of a digital camera, and the like.

The control section 660 is equipped mainly with a memory that stores control programs and the like to control the respective sections, a piezoelectric element driving circuit that drives the piezoelectric elements (vibration source) 54 and controls ink jetting timings, a driving circuit that drives the printing device 640 (carriage motor 641), a driving circuit that drives the paper feeding device 650 (paper feeding motor 651), a communication circuit that obtains printing data from a host computer, and a CPU that is electrically connected to these circuits, and performs various controls at each of the sections, although none of them are illustrated.

Also, the CPU is electrically connected to various kinds of sensors that can detect the amount of ink remaining in the ink cartridges 631, and printing environments such as the position, temperature, humidity and the like of the head unit 630. The control section 660 obtains printing data through the communication circuit, and stores the same in the memory. The CPU processes the printing data, and outputs driving signals to the corresponding driving circuits based on the processed data and input data from the variety of sensors. Based on the driving signals, the piezoelectric elements 54, the printing device 640 and the paper feeding device 650 are operated, respectively. By this, desired printing is performed on the recording paper P.

Because the ink jet printer 600 in accordance with the present embodiment is equipped with the ink jet recording head 50 of a high performance which is capable of arranging nozzles at a higher density, as described above, a high density printing and a high-speed printing become possible.

It is noted that the ink jet printer 600 in accordance with the present invention can also be used as a droplet discharge device that is used for industrial purposes, as described above. In this case, as ink (liquid material) to be jetted, a variety of functional materials may be used with their viscosity being appropriately adjusted by solvent, dispersion medium or the like.

Furthermore, the piezoelectric element in accordance with the present invention is not only applied to the ink jet recording head 50 and the ink jet printer 600 described above, but also applied to a variety of other devices.

As such devices, a surface acoustic wave element, a frequency filter, an oscillator, an electronic circuit, a thin film piezoelectric resonator, and an electronic apparatus, in accordance with embodiments of the present invention, are described below with reference to the drawings.

4-1. Surface Acoustic Wave Element

Figure 9:
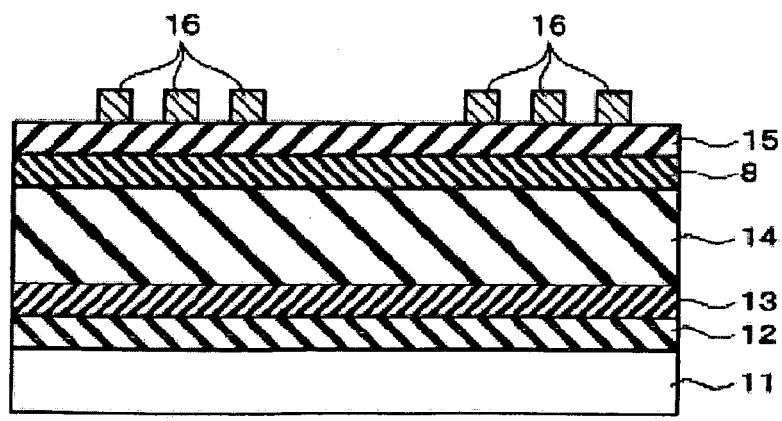
FIG. 9 is a side cross-sectional view of a surface acoustic wave element in accordance with an embodiment.
Figure 10:
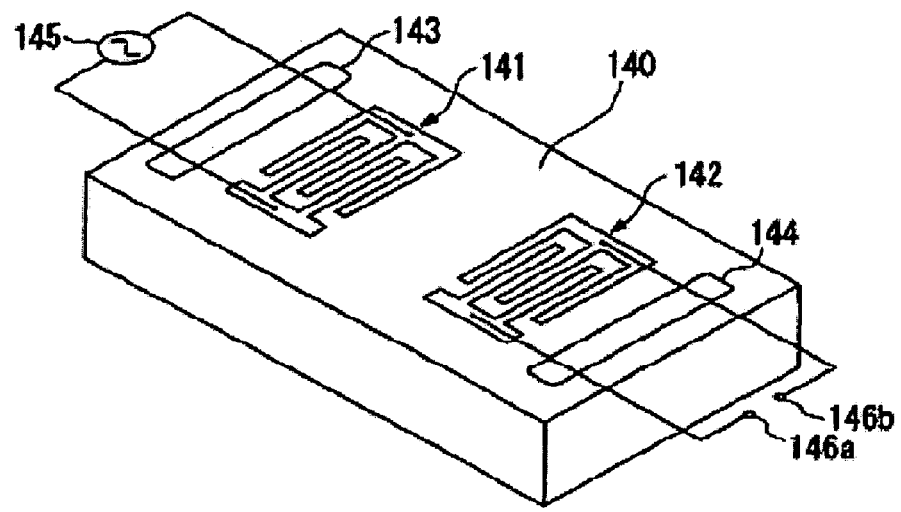
FIG. 10 is a perspective view of a frequency filter in accordance with an embodiment.
Figure 11:
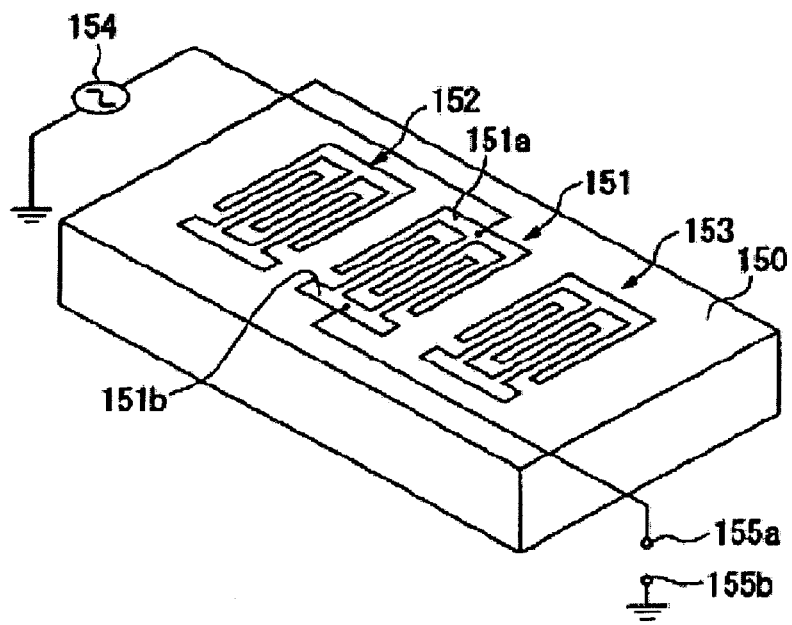
FIG. 11 is a perspective view of an oscillator in accordance with an embodiment.

A surface acoustic wave element, as shown in FIG. 9, is formed from a single-crystal silicon substrate 11, an oxide thin film layer 12, a buffer layer 13, a piezoelectric film 14, a barrier layer 8, and a protection layer 15 as a protection film formed of oxide or nitride, and an electrode 16. The electrode 16 is an inter-digital type electrode (Inter-Digital Transducer: hereafter referred to as "IDT electrode"), and has a configuration, as viewed from above, of an inter-digital transducer 141, 142, 151, 152 or 153, as shown in FIG. 10 and FIG. 11.

4-2. Method for Manufacturing Surface Acoustic Wave Element

Next, an example of a method for manufacturing a surface acoustic wave element in accordance with the present invention is described.

First, a (100) single-crystal silicon substrate is prepared as a single-crystal silicon substrate 11. As the single-crystal silicon substrate 11 to be prepared, a substrate with semiconductor elements such as thin film transistors (TFTs) formed in advance thereon may be used. In this case, the surface acoustic wave element obtained is integrated with these semiconductor elements.

Next, an oxide thin film layer 12 is formed on the single-crystal silicon substrate 11. The oxide thin film layer 12 may be formed by, for example, using a laser ablation method or the like. As the oxide thin film layer 12, a thin film of $IrO_2$, $TiO_2$ or the like may be used.

Next, a buffer layer 13 is formed by a liquid phase method on the oxide thin film layer 12, like in the case of forming the buffer layer 5 of the piezoelectric element 1 shown in FIG. 1. Then, a piezoelectric film 14 is formed on the buffer layer 13 by a liquid phase method, like in the case of forming the piezoelectric film 6 shown in FIG. 1. Then, a barrier layer 8 is formed by a liquid phase method on the piezoelectric film 14, like in the case of forming the barrier layer 8 of the piezoelectric element 1 shown in FIG. 1.

Next, a silicon oxide film is formed as a protection film 15 over the piezoelectric film 14 by, for example, a laser ablation method. The protection film 15 protects the piezoelectric film 14 from the atmosphere, and prevents influences by, for example, moisture and impurities in the atmosphere, and at the same time, plays a role to control temperature characteristics of the piezoelectric film 14. It is noted that the material of the protection film is not limited to silicon oxide as long as such purposes are fulfilled.

Then, an aluminum thin film, for example, is formed on the protective layer 15, and then is patterned, thereby forming an electrode 16 having a desired configuration, which is called IDT, to obtain the surface acoustic wave element shown in FIG. 9.

In the surface acoustic wave element in accordance with the present embodiment, because the piezoelectric film 14 has excellent piezoelectric characteristics, the surface acoustic wave element itself has a high performance.

5-1. Frequency Filter

Next, a frequency filter is described. FIG. 10 shows a frequency filter in accordance with an embodiment of the present invention.

As shown in FIG. 10, the frequency filter has a substrate 140. As the substrate 140, a substrate with which, for example, the surface acoustic wave element shown in FIG. 9 is formed. More specifically, the substrate includes, on a (100) single-crystal silicon substrate 11, an oxide thin film layer 12, a buffer layer 13, a piezoelectric film 14, a barrier layer 8, and a protection layer 15 laminated in this order. The protection layer 15 is formed of oxide or nitride as a protection film.

On the upper surface of the substrate 140, IDT electrodes 141 and 142 are formed. The IDT electrodes 141 and 142 are formed from, for example, Al or an Al alloy, and its thickness is set to about $\frac{1}{100}$ of the pitch of the IDT electrode 141, 142. Moreover, acoustic absorber sections 143 and 144 are formed on an upper surface of the substrate 140 in a manner to interpose the IDT electrodes 141 and 142. The acoustic absorber sections 143 and 144 absorb surface acoustic waves propagating on the surface of the substrate 140. A high frequency signal source 145 is connected with the IDT electrode 141 formed on the substrate 140, and a signal line is connected with the IDT electrode 142.

5-2. Operation of Frequency Filter

Next, operations of the frequency filter descried above are described. When a high frequency signal is outputted from the high frequency signal source 145 in the structure described above, this high frequency signal is impressed to the IDT electrode 141. As a result, surface acoustic waves are generated on the upper surface of the substrate 140. The surface acoustic waves propagate over the top surface of the substrate 140 at a speed of approximately 5000 m/s. The surface acoustic waves propagating from the IDT electrode 141 toward the acoustic absorbing portion 143 are absorbed at the acoustic absorbing portion 143. However, from among the surface acoustic waves propagating toward the IDT electrode 142, only those surface acoustic waves with a specific frequency or specific band frequency determined according to the pitch and the like of the IDT electrode 142 are converted to electric signals, and outputted to terminals 146a and 146b via the signal line. It is noted that the majority of the frequency components other than the aforementioned specific frequency or specific band frequency are absorbed by the acoustic absorbing portion 144 after passing through the IDT electrode 142. In this way, of the electric signals supplied to the IDT electrode 141 provided in the frequency filter of the present embodiment, only surface acoustic waves of a specific frequency or a specific band frequency can be obtained (i.e., can be filtered).

6-1. Oscillator

Next, an oscillator is described. FIG. 11 shows an oscillator in accordance with an embodiment of the present invention.

As shown in FIG. 11, the oscillator has a substrate 150. As the substrate 150, a substrate with the surface acoustic wave element shown in FIG. 9 formed thereon, for example, is used, like the aforementioned frequency filter. More specifically, the substrate includes, on a (110) single-crystal silicon substrate 11, an oxide thin film layer 12, a buffer layer 13, a piezoelectric film 14, a barrier layer 8, and a protection layer 15 laminated in this order. The protection layer 15 is composed of oxide or nitride as a protection film.

On the upper surface of the substrate 150, an IDT electrode 151 is formed. Furthermore, IDT electrodes 152 and 153 are formed in a manner to interpose the IDT electrode 151. The IDT electrodes 151-153 are formed from, for example, Al or an Al alloy, and their thickness is set to about $\frac{1}{100}$ of the pitch of each of the IDT electrodes 151-153, respectively. A high frequency signal source 154 is connected with one of comb teeth-shape electrodes 151a composing the IDT electrode 151, and a signal line is connected with the other comb teeth-shape electrode 151b. It is noted that this IDT electrode 151 corresponds to an electric signal application electrode, while the IDT electrodes 152 and 153 correspond to resonating electrodes for resonating a specific frequency or a specific band frequency of the surface acoustic waves generated by the IDT electrode 151.

6-2. Operations of Oscillator

Next, operations of the oscillator described above are described. When a high frequency signal is outputted from the high frequency signal source 154 in the structure described above, this high frequency signal is impressed on one of the IDT electrode 151, i.e., to the comb teeth-shaped electrode 151a. As a result, surface acoustic waves are generated on the upper surface of substrate 150 that propagate toward the IDT electrode 152 and toward the IDT electrode 153. It is noted that the speed of this surface acoustic waves is approximately 5000 m/s. Of these surface acoustic waves, those surface acoustic waves of a specific frequency component are reflected at the IDT electrodes 152 and 153, and a standing wave is generated between the IDT electrode 152 and the IDT electrode 153.

The surface acoustic wave of this specific frequency component is repeatedly reflected at the IDT electrodes 152 and 153. As a result, specific frequency components or specific band frequency components are resonated and their amplitude increases. A portion of the surface acoustic waves of the specific frequency component or the specific band frequency component is extracted from the other of the IDT electrode 151, i.e., the comb teeth-shaped electrode 151b, and the electric signal of the frequency (or the frequency of a certain band) corresponding to the resonance frequency between the IDT electrode 152 and the IDT electrode 153 can be extracted at terminals 155a and 155b.

6-3. Voltage Controlled SAW Oscillator

Figure 12A:
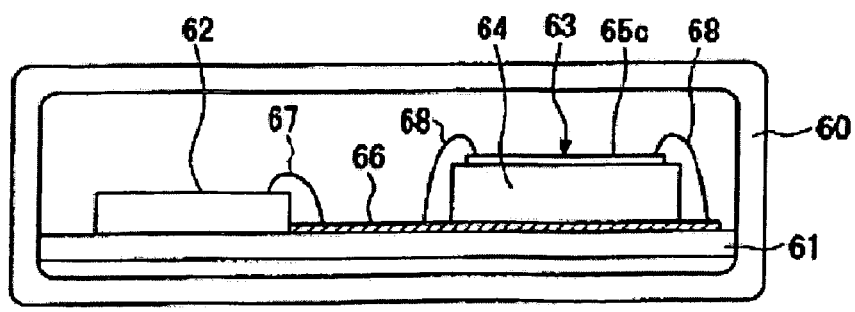
FIG. 12A is a see-through side view schematically showing an example in which the oscillator is applied as a VCSO.
Figure 12B:
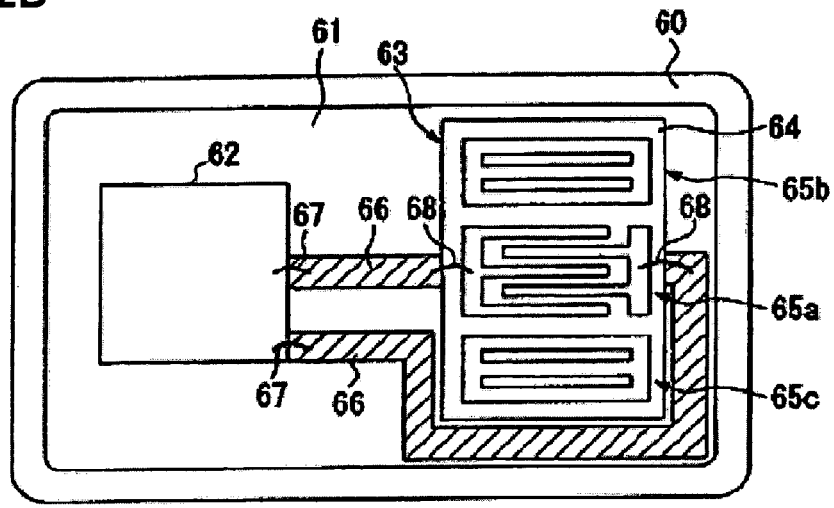
FIG. 12B is a see-through plan view schematically showing an example in which the oscillator is applied as a VCSO.

FIGS. 12A and 12B are views showing an example in which the oscillator (surface acoustic wave element) in accordance with the present invention is applied to a VCSO (Voltage Controlled SAW Oscillator), wherein FIG. 12A is a see-through view seen from the side, and FIG. 12B is a see-through view seen from above.

The VCSO is housed inside a metallic (Al or stainless steel) box 60. On a substrate 61 is mounted an IC (integrated circuit) 62 and an oscillator 63. In this case, the IC 62 is an oscillation circuit that controls the frequency impressed on the oscillator 63 in response to a voltage inputted from an external circuit (not shown).

The oscillator 63 includes IDT electrodes 65a-65c formed on a substrate 64. This structure is generally equivalent to the oscillator shown in FIG. 11. It is noted that this substrate 64 includes, on a (100) single-crystal silicon substrate 11, an oxide thin film layer 12, a buffer layer 13, a piezoelectric film 14, a barrier film 8, and a protection layer 15 laminated in this order, like the aforementioned example shown in FIG. 9. The protection layer 15 is formed of oxide or nitride as a protection film.

A wiring 66 is patterned onto the substrate 61 in order to electrically connect the IC 62 and the oscillator 63. The IC 62 and the wiring 66 are, for example, connected by a wire 67 which is a gold wire or the like, and the oscillator 63 and the wiring 66 are connected by a wire 68 which is a gold wire or the like, whereby the IC 62 and the oscillator 63 are electrically connected via the wiring 66.

It is noted that, the VCSO can also be formed by integrating the IC 62 and the oscillator (surface acoustic wave element) 63 on the same substrate.

Figure 13:
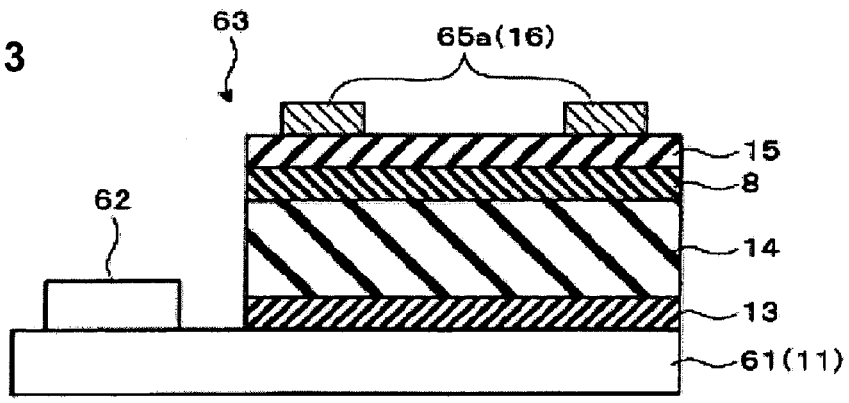
FIG. 13 is a view schematically shown an example in which the oscillator is applied as a VCSO.

FIG. 13 shows a view schematically showing a VCSO in which the IC 62 and the oscillator 63 are integrated. It is noted that the oscillator 63 in FIG. 13 has a structure in which the formation of the oxide thin film layer 12 is omitted from the surface acoustic wave element shown in FIG. 9.

As shown in FIG. 13, the VCSO is formed in a manner that the IC 62 and the oscillator 63 share a single-crystal silicon substrate 61 (single-crystal silicon substrate 11). The IC 62 and electrodes 65a (electrodes 16) provided on the oscillator 63 are electrically connected (although not shown). In the present embodiment, TFTs (thin film transistors) are particularly used as transistors that compose the IC 62.

By using TFTs as transistors that compose the IC 62, in the present embodiment, first, an oscillator 63 (surface acoustic wave element) is formed on a single-crystal silicon substrate 61. Then, TFTs that are formed on a second substrate different from the single-crystal silicon substrate 61 are transferred onto the single-crystal silicon substrate 61, to thereby integrate the TFTs and the oscillator 63. Even if a material is difficult to directly form or unsuitable to form TFTs on the substrate, they can be excellently formed by transfer. Various methods may be used as the transfer method, but in particular, the transfer method described in Japanese Laid-open Patent Application HEI 11-26733 can be preferentially used.

Figure 14:
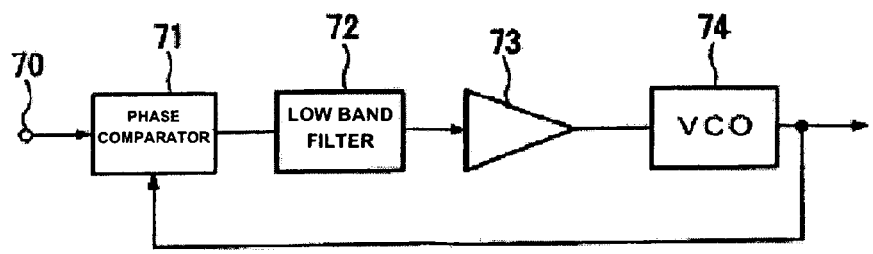
FIG. 14 is a block diagram showing the basic structure of a PLL circuit.

The VCSO shown in FIG. 12 and FIG. 13 can be employed as a VCO (Voltage Controlled Oscillator) for a PLL circuit shown in FIG. 14, for example. The PLL circuit is briefly explained below.

FIG. 14 is a block diagram showing the basic structure of a PLL circuit. As shown in FIG. 14, the PLL circuit is composed of a phase comparator 71, a low band filter 72, an amplifier 73 and a VCO 74.

The phase comparator 71 compares the phase (or frequency) of the signal inputted from an input terminal 70 and the phase (or frequency) of the signal outputted from the VCO 74, and outputs an error voltage signal, the value of which is set according to the difference between the aforementioned signals. The low band filter 72 transmits only the low frequency components at the position of the error voltage signal outputted from the phase comparator 71, and the amplifier 73 amplifies the signal outputted from the low band filter 72. The VCO 74 is an oscillator circuit in which the oscillation frequency is continuously changed within a certain range, corresponding to the voltage value inputted.

The PLL circuit having such a structure operates so as to decrease the difference between the phase (or frequency) inputted from the input terminal 70 and the phase (or frequency) of the signal outputted from the VCO 74, and synchronizes the frequency of the signal outputted from the VCO 74 with the frequency of the signal inputted from the input terminal 70. When the frequency of the signal outputted from the VCO 74 is synchronized with the frequency of the signal inputted from the input terminal 70, it matches with the signal inputted from the input terminal 70 after excluding a specific phase difference, and a signal which conforms to the changes in the input signal is outputted.

Electronic Circuit

Figure 15:
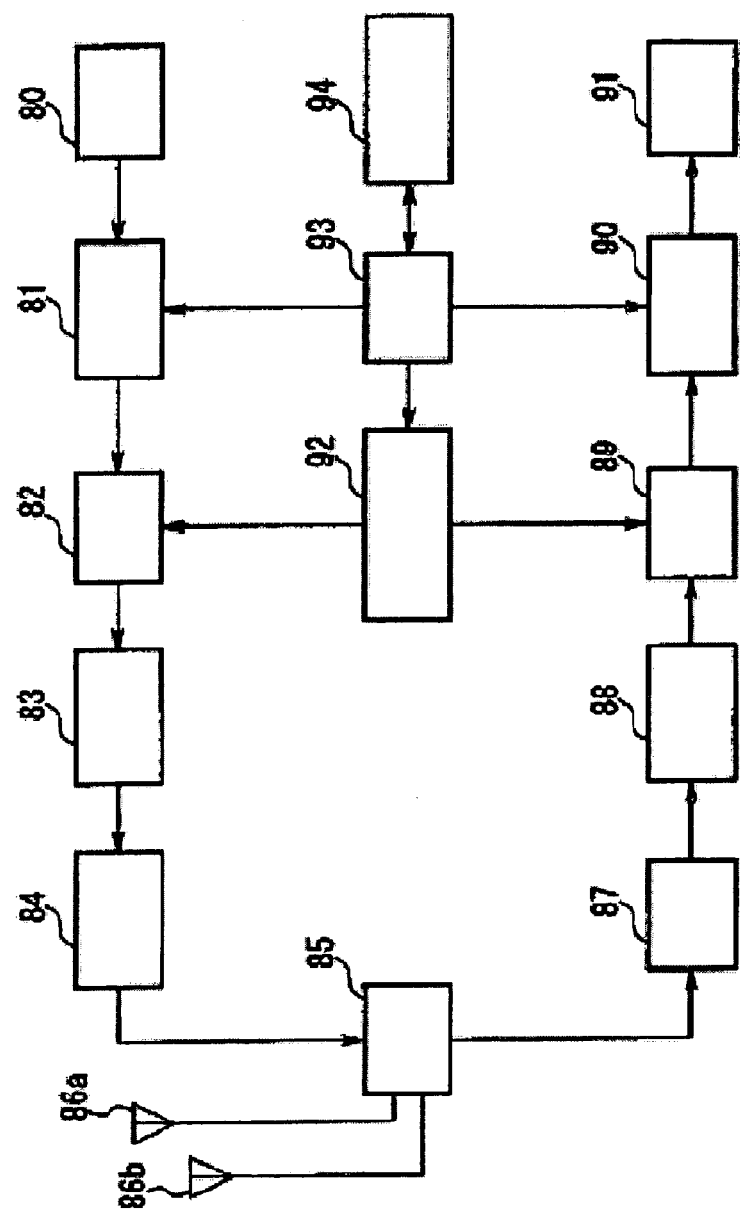
FIG. 15 is a block diagram showing the structure of an electronic circuit in accordance with an embodiment.

FIG. 15 is a block diagram showing an electrical structure of an electronic circuit in accordance with an embodiment of the present invention. It is noted that the electronic circuit shown in FIG. 15 is a circuit that is provided inside a cellular phone 100 shown in FIG. 16, for example. The cellular phone 100 shown in FIG. 16 is an example of an electronic apparatus in accordance with the present invention, and composed of an antenna 101, a receiver 102, a transmitter 103, a liquid crystal display 104, operating buttons 105, and the like.

The electronic circuit shown in FIG. 15 has the basic structure of an electronic circuit provided inside the cellular phone 100, and is equipped with a transmitter 80, a transmission signal processing circuit 81, a transmission mixer 82, a transmission filter 83, a transmission power amplifier 84, a transceiver wave divider 85, antennas 86a, 86b, a low noise amplifier 87, a reception filter 88, a reception mixer 89, a reception signal processing circuit 90, a receiver 91, a frequency synthesizer 92, a control circuit 93, and an input/display circuit 94. It is noted that cellular telephones currently put in practical use have a more complicated circuit structure due to the fact that they perform frequency converting processes multiple times.

Figure 16:
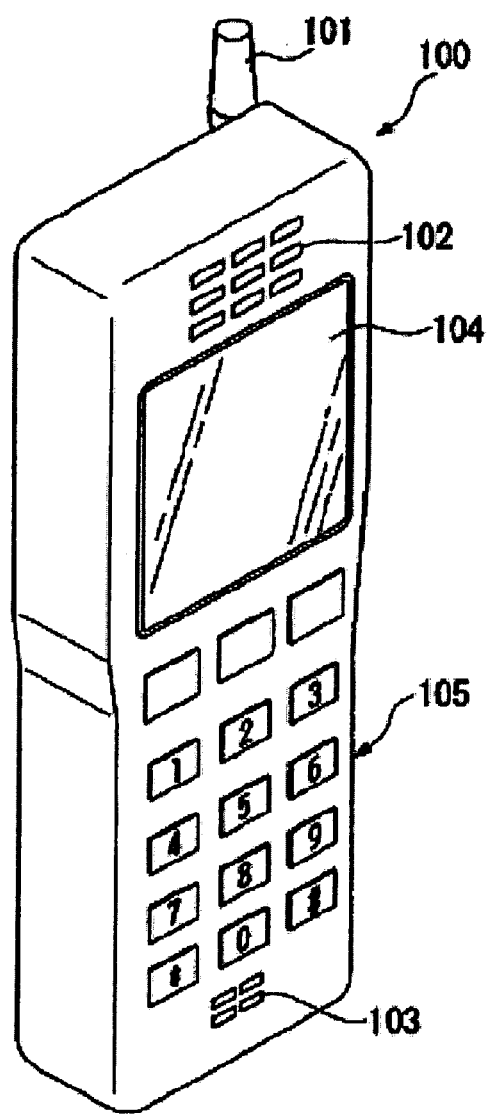
FIG. 16 is a perspective view showing a cellular telephone as one type of electronic device according to an embodiment.

The transmitter 80 can be realized with a microphone or the like which converts sound wave signals into electric signals, for example, and may correspond to the transmitter 103 in the cellular phone 100 shown in FIG. 16. The transmission signal processing circuit 81 is a circuit for performing such processing as D/A conversion, modulation, etc. on the electric signal to be outputted from the transmitter 80. The transmission mixer 82 mixes the signal outputted from the transmission signal processing circuit 81 using the signal outputted from the frequency synthesizer 92. It is noted that the frequency of the signal supplied to the transmission mixer 82 is about 380 MHz, for example. The transmission filter 83 permits passage of only those signals of the required frequency from among the intermediate frequencies (hereafter referred to as "IF"), and cuts unnecessary frequency signals. It is noted that the signal outputted from the transmission filter 83 is converted to an RF signal by a converting circuit not shown in the figures. The frequency of this RF signal is about 1.9 GHz, for example. The transmission power amplifier 84 amplifies the power of the RF signal outputted from the transmission filter 83 and outputs this amplified result to the transceiver wave divider 85.

The transceiver wave divider 85 outputs the RF signal outputted from the transmission power amplifier 84 to the antennas 86a and 86b, and transmits the signal in the form of radio waves from the antennas 86a and 86b. Also, the transceiver wave divider 85 divides the reception signal received by the antennas 86a and 86b, and outputs the result to the low noise amplifier 87. It is noted that the frequency of the reception signal outputted from the transceiver wave divider 85 is, for example, around 2.1 GHz. The low noise amplifier 87 amplifies the reception signal from the transceiver wave divider 85. It is noted that the signal outputted from the low noise amplifier 87 is converted to an intermediate signal (IF) by a converting circuit not shown in the figures.

The reception filter 88 permits passage of only those signals of the required frequency from among the intermediate frequencies (IF) that were converted by a converting circuit not shown in the figures, and cuts unnecessary frequency signals. The reception mixer 89 employs the signal outputted from the frequency synthesizer 92 to mix the signals outputted from the transmission signal processing circuit 81. It is noted that the intermediate frequency supplied to the reception mixer 89 is, for example, about 190 MHz. The reception signal processing circuit 90 performs such processing as A/D conversion, modulation, etc., to the signal outputted from the reception mixer 89. The receiver 91 is realized by means of a small speaker or the like which converts electric signals into sound waves, for example, and corresponds to the receiver 102 in the cellular telephone 100 shown in FIG. 16.

The frequency synthesizer 92 is a circuit for generating the signal (at a frequency of about 380 MHz, for example) to be supplied to the transmission mixer 82 and the signal (at a frequency of 190 MHz, for example) to be supplied to the reception mixer 89. The frequency synthesizer 92 is equipped with a PLL circuit for generating a signal at 760 MHz, for example. The frequency synthesizer 92 divides the signal outputted from this PLL circuit to generate a 380 MHz frequency signal, for example, and then further divides this signal to generate a 190 MHz frequency signal. The control circuit 93 controls the transmission signal processing circuit 81, the reception signal processing circuit 90, the frequency synthesizer 92, and the input/display circuit 94, thereby controlling the overall operation of the cellular telephone. The input/display circuit 94 displays the device status to the user of the cellular phone 100 shown in FIG. 16, and is provided for the user to input directions. This input/display circuit 94 corresponds, for example, to the liquid crystal display 104 and the operating buttons 105 on the cellular phone 100.

In an electronic circuit of the above-described structure, the frequency filter shown in FIG. 10 is employed as the transmission filter 83 and the reception filter 88. The frequency that is filtered (i.e., the frequency which is permitted to pass through the filter) is set separately at the transmission filter 83 and the reception filter 88 in response to the required frequency in the signal outputted from the transmission mixer 82 and the required frequency at the reception mixer 89. The PLL circuit that is provided within the frequency synthesizer 92 is provided with the oscillator shown in FIG. 11 or the oscillator (VCSO) shown in FIGS. 12A, 12B and 13 as the VCO 74 of the PLL circuit shown in FIG. 14.

8-1. First Thin Film Piezoelectric Resonator

Figure 17:
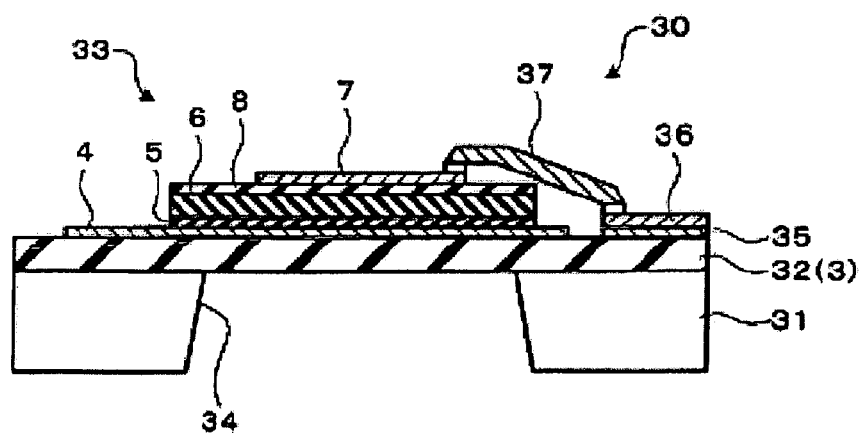
FIG. 17 is a side cross-sectional view showing a thin film piezoelectric resonator in accordance with an embodiment.

Next, a first thin film piezoelectric resonator is described. FIG. 17 shows a thin film piezoelectric resonator in accordance with a first embodiment of the present invention. A thin film piezoelectric resonator 30 shown in FIG. 17 is a diaphragm type thin film piezoelectric resonator 30, particularly used as a communication device and a communication filter. The thin film piezoelectric resonator 30 includes a resonator 33 formed through an elastic plate 32 over a base substrate 31 formed of a single-crystal silicon substrate.

The base substrate 31 is formed of a single-crystal silicon substrate having a thickness of about 200 μm with a (110) orientation, and defines, on a bottom surface side of the base substrate 31 (on the opposite side of the elastic plate 32), a via hole 34 penetrating from the bottom surface side to an upper surface side of the base substrate 31.

The elastic plate 32 is formed with the elastic film 3 in the piezoelectric element 1 shown in FIG. 1 in the present embodiment, and is formed on a (110) plane of the base substrate 31. Moreover, the resonator 33 is formed with the lower electrode 4, the buffer layer 5, the piezoelectric film 6, the barrier layer 8, and the upper electrode 7 in the piezoelectric element 1 shown in FIG. 1. The thin film piezoelectric resonator 30 thus composed has a structure in which the main portion (except the base substrate 2) of the piezoelectric element 1 shown in FIG. 1 is formed as is on the base substrate 31.

It is noted that the elastic plate 32 can be formed as follows. For example, silicon nitride (SiN) is formed to a thickness of about 200 nm on the base substrate 31, then silicon dioxide (SiO$_2$) is formed thereon to a thickness of about 400 nm to 3 µm, and the elastic film 3 is formed on them, such that the laminated films of silicon nitride, silicon dioxide and elastic film 3 can be used as the elastic plate 32. Alternatively, when silicon nitride and silicon dioxide films are formed on the base substrate 31, the elastic film 3 may not be formed, such that the elastic plate 32 can be formed only with these laminated films.

The lower electrode 4 is formed of, for example, Pt with a (111) orientation. The thickness of the lower electrode 4 is, for example, about 200 nm.

The buffer layer 5 is formed of a piezoelectric material of a perovskite type having a rhombohedral structure or a pseudo cubic structure, and is composed of PZTN that is preferentially oriented to pseudo cubic (100). The thickness of the buffer layer 5 may be, for example, 0.1 µm or less.

The piezoelectric film 6 is composed of a relaxor material of a perovskite type having a rhombohedral structure, and preferentially oriented to pseudo cubic (100). The thickness of the piezoelectric film 6 is, for example, about 0.9 µm.

The barrier layer 8 is formed of a piezoelectric material of a perovskite type having a rhombohedral structure or a pseudo cubic structure, and is composed of PZTN that is preferentially oriented to pseudo cubic (100). The thickness of the barrier layer 8 may be, for example, 0.1 µm or less.

The upper electrode 7 is formed of Pt, like the lower electrode 4. The upper electrode 7 is thickly formed to a thickness of about 700 nm in the present embodiment. It is noted that the upper electrode 7 is provided with a wiring 37 formed of gold or the like through a pad 36, for electrically connecting to an electrode 35 formed on the elastic plate 32.

8-2. Method for Manufacturing First Thin Film Piezoelectric Resonator

Next, a method for manufacturing the aforementioned thin film piezoelectric resonator 30 is described. First, a base material that becomes the base substrate 31, in other words, a silicon single-crystal substrate (Si substrate) with a (110) orientation described above, is prepared. Then, an elastic film 3 is formed on the Si substrate, and further, a lower electrode 4, a buffer layer 5, a piezoelectric film 6, a barrier layer 8, and an upper electrode 7 are successively formed thereon. When the laminated films of silicon nitride, silicon dioxide and elastic film 3 are used as the elastic plate 32, silicon nitride and silicon dioxide are formed in this order on the silicon substrate prior to forming the elastic film 3.

Then, the upper electrode 7, the barrier layer 8, the piezoelectric film 6, the buffer layer 5, and the lower electrode 4 are patterned so as to correspond to the via hole 34 to be formed, thereby forming the resonator 33. It is noted that, in particular, when the lower electrode 4 is to be patterned, the electrode 35 is also formed at the same time, separately from the lower electrode 4, as shown in FIG. 17.

Then, the single-crystal silicon substrate is processed (patterned) by etching or the like from its bottom side, to form the via hole 34 that penetrates the substrate. Then, a pad 36 and a wiring 37 for connecting the upper electrode 7 and the electrode 35 are formed.

By the process described above, the first thin film piezoelectric resonator 30 in accordance with the present embodiment can be manufactured.

In the first thin film piezoelectric resonator 30 in accordance with the present embodiment, the piezoelectric film 6 of the resonator 33 has excellent piezoelectric characteristics, and therefore has a high electromechanical coupling factor. For this reason, it can be used in a high-frequency area, such as, for example, a GHz band, and can excellently function despite its smallness (thinness).

8-3. Second Thin Film Piezoelectric Resonator

Figure 18:
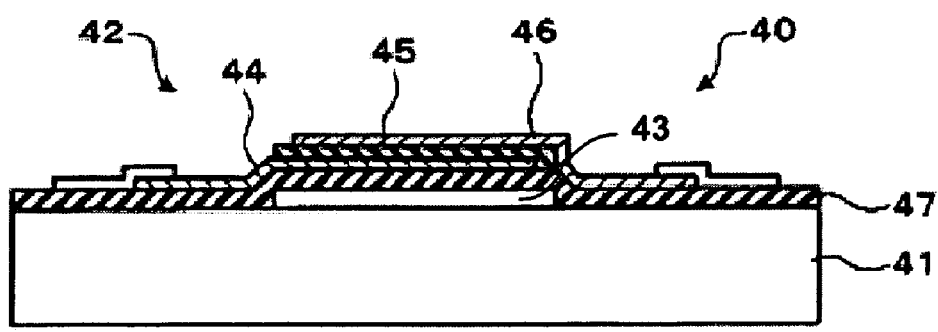
FIG. 18 is a side cross-sectional view showing a thin film piezoelectric resonator in accordance with an embodiment.

FIG. 18 shows a second thin film piezoelectric resonator in accordance with another embodiment of the present invention. The thin film piezoelectric resonator 40 is different mainly from the thin film piezoelectric resonator 30 shown in FIG. 17 in that an air gap 43 is formed between the base substrate 41 and the resonator 42 without forming a via hole.

More specifically, the thin film piezoelectric resonator 40 includes a resonator 42 formed over a base substrate 41 formed of a single-crystal silicon substrate with a (110) orientation. The resonator 42 is formed from a lower electrode 44, a piezoelectric material layer 45, and an upper electrode 46. It is noted that the lower electrode 44 is composed of the same material as that of the lower electrode 4 described above. The piezoelectric material layer 45 is formed from a buffer layer composed of the same material as that of the buffer layer 5 described above, a piezoelectric film composed of the same material as that of the piezoelectric film 6 described above, and a barrier layer composed of the same material as that of the barrier layer 8 described above. The upper electrode 46 is composed of the same material as that of the upper electrode 7 described above. The resonator 42 is formed by laminating the lower electrode 44, the piezoelectric material layer 45 and the upper electrode 46 particularly over the air gap 43.

In the present embodiment, an elastic film 3 (see FIG. 1) is formed in a state to cover the air gap 43 on the lower side of the lower electrode 44, wherein the elastic film 3 defines an elastic plate 47 like the aforementioned example. The elastic plate 47 can also be formed as follows. Like the aforementioned example, on the base substrate 41, layers of silicon nitride and silicon dioxide, or only silicon dioxide may be formed, and then the elastic film 3 is formed on them, such that these laminated films define the elastic plate 47. Alternatively, the elastic plate 47 may be formed with laminated layers of silicon nitride and silicon dioxide, or only silicon dioxide, without forming the elastic film 3.

8-4. Method for Manufacturing Second Thin Film Piezoelectric Resonator 40

To form the second thin film piezoelectric resonator 40, first, a film of germanium (Ge), for example, is formed by vapor deposition or the like on the base substrate 41, and is then patterned in the same shape as the shape of an air gap, thereby forming a sacrificial layer.

Then, an elastic plate 47 covering the sacrificial layer is formed. It is noted that, prior to this, layers of silicon nitride and silicon dioxide may be formed, or only a layer of silicon dioxide may be formed. Then, the elastic plate 47 is patterned in a desired shape.

Next, a layer covering the elastic plate 47, which becomes to be a lower electrode 44, is formed, and then it is patterned by dry etching or the like, thereby forming the lower electrode 44. Then, a buffer layer, a piezoelectric film and a barrier layer covering the lower electrode 44 are formed in this order. In other words, layers are formed with these laminated layers which become a piezoelectric material layer 45. Then, the layers are patterned by dry etching or the like, to form the piezoelectric material layer 45.

Then, a layer covering the piezoelectric material layer 45, which becomes to be an upper electrode 46, is formed, and then it is patterned by dry etching or the like, thereby forming the upper electrode 46. It is noted that, when the elastic plate 47, the lower electrode 44, the piezoelectric material layer 45 and the upper electrode 46 are formed by patterning over the sacrificial layer in this manner, a portion of the sacrificial layer is exposed externally. Then, the above-described sacrificial layer is etched and removed from the base substrate 41 by, for example, hydrogen peroxide solution ($H_2O_2$), thereby forming the air gap 43.

By the process described above, the thin film piezoelectric resonator 40 in accordance with the present embodiment can be manufactured.

It the second thin film piezoelectric resonator 40 in accordance with the present embodiment, because the piezoelectric film of the resonator 42 has excellent piezoelectric characteristics, and therefore has a high electromechanical coupling factor. Accordingly, it can be used in a high-frequency area, such as, for example, a GHz band. Also, it can excellently function despite its smallness (thinness).

Also, when appropriately combined with circuit composing elements such as inductances, capacitors and the like, the above-described thin film piezoelectric resonator 30 or 40 composes an excellent induction filter.

The surface acoustic wave element, the frequency filter, the oscillator, the electronic circuit, the thin film piezoelectric resonator and the electronic apparatus (cellular phone 100) in accordance with the embodiments of the present invention were explained above. However, the present invention is not limited to the above-described embodiments, and a variety of modifications may be freely made within the scope of the invention.

For example, the embodiments were explained using a cellular phone as an example of an electronic apparatus and an electronic circuit provided inside the cellular telephone as an example of an electronic circuit. However, the present invention is not limited to a cellular phone, and may be applied to a variety of mobile communications devices and their internal electronic circuits.

Furthermore, the present invention is not limited to mobile communications devices, but may also be applied to communications devices used in a stationary state such as tuners for receiving BS and CS broadcasting, and their internal electronic circuits provided therein. Moreover, the present invention is neither limited to communications devices employing radio waves propagating through air as the communications carrier, but may also be applied to electronic devices and their internal circuitry, such as HUB, which employ high-frequency signals propagating through a co-axial cable or optical signals propagating through an optical cable.

What is claimed is:

1. A piezoelectric element comprising:
   a base substrate;
   a buffer layer formed above the base substrate;
   a piezoelectric film formed above the buffer layer; and
   a barrier layer formed above the piezoelectric film,
   wherein the buffer layer and the barrier layer are formed of $Pb((Zr_{1-x}Ti_x)_{1-y}Nb_y)O_3$ of a perovskite type,
   where x is in a range of $0 \leq x \leq 1$, and
   y is in a range of $0.05 \leq y \leq 0.3$, and
   the piezoelectric film is formed of a relaxor material of a perovskite type.

2. A piezoelectric element according to claim 1, wherein the buffer layer has a rhombohedral structure, and is preferentially oriented to pseudo cubic (100).

3. A piezoelectric element according to claim 1, wherein the buffer layer has a pseudo cubic structure, and is preferentially oriented to pseudo cubic (100).

4. A piezoelectric element according to claim 1, wherein the barrier layer has a rhombohedral structure, and is preferentially oriented to pseudo cubic (100).

5. A piezoelectric element according to claim 1, wherein the barrier layer has a pseudo cubic structure, and is preferentially oriented to pseudo cubic (100).

6. A piezoelectric element according to claim 1, wherein the piezoelectric film has a rhombohedral structure, and is preferentially oriented to pseudo cubic (100).

7. A piezoelectric element according to claim 1, wherein the relaxor material is formed of at least one type of materials shown by formulae (1)-(9) as follows:

$$(1-x)Pb(Sc_{1/2}Nb_{1/2})O_3-xPb(Zr_{1-y}Ti_y)O_3 \quad \text{Formula (1)}$$

(where, x is 0.10<x<0.42, and y is $0 \leq y \leq 1$)

$$(1-x)Pb(In_{1/2}Nb_{1/2})O_3-xPb(Zr_{1-y}Ti_y)O_3 \quad \text{Formula (2)}$$

(where, x is 0.10<x<0.37, and y is $0 \leq y \leq 1$)

$$(1-x)Pb(Ga_{1/2}Nb_{1/2})O_3-xPb(Zr_{1-y}Ti_y)O_3 \quad \text{Formula (3)}$$

(where, x is 0.10<x<0.50, and y is $0 \leq y \leq 1$)

$$(1-x)Pb(Sc_{1/2}Ta_{1/2})O_3-xPb(Zr_{1-y}Ti_y)O_3 \quad \text{Formula (4)}$$

(where, x is 0.10<x<0.45, and y is $0 \leq y \leq 1$)

$$(1-x)Pb(Mg_{1/3}Nb_{2/3})O_3-xPb(Zr_{1-y}Ti_y)O_3 \quad \text{Formula (5)}$$

(where, x is 0.10<x<0.35, and y is $0 \leq y \leq 1$)

$$(1-x)Pb(Fe_{1/2}Nb_{1/2})O_3-xPb(Zr_{1-y}Ti_y)O_3 \quad \text{Formula (6)}$$

(where, x is 0.01<x<0.10, and y is $0 \leq y \leq 1$)

$$(1-x)Pb(Zn_{1/3}Nb_{2/3})O_3-xPb(Zr_{1-y}Ti_y)O_3 \quad \text{Formula (7)}$$

(where, x is 0.01<x<0.10, and y is $0 \leq y \leq 1$)

$$(1-x)Pb(Ni_{1/3}Nb_{2/3})O_3-xPb(Zr_{1-y}Ti_y)O_3 \quad \text{Formula (8)}$$

(where, x is 0.10<x<0.38, and y is $0 \leq y \leq 1$)

$$(1-x)Pb(Co_{1/2}W_{1/2})O_3-xPb(Zr_{1-y}Ti_y)O_3 \quad \text{Formula (9)}$$

(where, x is 0.10<x<0.42, and y is $0 \leq y \leq 1$).

8. A piezoelectric element according to claim 1, wherein the relaxor material is formed of at least one type of materials shown by formulae (1)-(9) as follows:

$$(1-x)Pb(Sc_{1/2}Nb_{1/2})O_3-xPbTiO_3 \quad \text{Formula (1)}$$

(where, x is 0.10<x<0.42)

$$(1-x)Pb(In_{1/2}Nb_{1/2})O_3-xPbTiO_3 \quad \text{Formula (2)}$$

(where, x is 0.10<x<0.37)

$$(1-x)Pb(Ga_{1/2}Nb_{1/2})O_3-xPbTiO_3 \quad \text{Formula (3)}$$

(where, x is 0.10<x<0.50)

$$(1-x)Pb(Sc_{1/2}Ta_{1/2})O_3-xPbTiO_3 \quad \text{Formula (4)}$$

(where, x is 0.10<x<0.45)

$$(1-x)Pb(Mg_{1/3}Nb_{2/3})O_3-xPbTiO_3 \quad \text{Formula (5)}$$

(where, x is 0.10<x<0.35)

$$(1-x)Pb(Fe_{1/2}Nb_{1/2})O_3-xPbTiO_3 \quad \text{Formula (6)}$$

(where, x is 0.01<x<0.10)

$$(1-x)Pb(Zn_{1/3}Nb_{2/3})O_3-xPbTiO_3 \quad \text{Formula (7)}$$

(where, x is 0.01<x<0.10)

$$(1-x)Pb(Ni_{1/3}Nb_{2/3})O_3-xPbTiO_3 \quad \text{Formula (8)}$$

(where, x is 0.10<x<0.38)

$$(1-x)Pb(Co_{1/2}W_{1/2})O_3-xPbTiO_3 \quad \text{Formula (9)}$$

(where, x is 0.10<x<0.42).

9. A piezoelectric element according to claim 1, wherein the buffer layer and barrier layer include Si, or Si and Ge by 5 mol % or less.

10. A piezoelectric element according to claim 1, comprising
a lower electrode formed above the base substrate,
the buffer layer formed above the lower electrode, and
an upper electrode formed above the barrier layer.

11. A piezoelectric element according to claim 1, wherein at least one of the lower electrode and the upper electrode is formed from a material mainly formed of Pt.

12. A piezoelectric element according to claim 1, wherein the piezoelectric element is used in an ink jet recording head equipped with a cavity having a volume that is changeable, and the volume of the cavity is changed by a deformation of the piezoelectric film.

13. A piezoelectric actuator equipped with the piezoelectric element according to claim 1.

14. An ink jet recording head comprising the piezoelectric element according to claim 1.

15. An ink jet printer comprising the ink jet recording head according to claim 14.

16. A surface acoustic wave element comprising the piezoelectric element according to claim 1 formed above a substrate.

17. A frequency filter comprising:
a first electrode that is formed above the piezoelectric film of the surface acoustic wave element according to claim 16; and
a second electrode that is formed above the piezoelectric film, resonates at a specified frequency or a specified band frequency in surface acoustic waves generated in the piezoelectric film by an electrical signal applied to the first electrode, and converts the specified frequency or the specified band frequency to an electrical signal.

18. An oscillator comprising:
an electrical signal application electrode that is formed above the piezoelectric film of the surface acoustic wave element according to claim 16, and generates surface acoustic waves in the piezoelectric film by an electrical signal applied, and
an oscillation circuit including a resonation electrode that is formed above the piezoelectric film, and resonates at a specified frequency or a specified band frequency in the surface acoustic waves generated by the electrical signal application electrode, and transistors.

19. An electronic circuit comprising:
the oscillator according to claim 18; and
an electrical signal supplying element that applies the electrical signal to the electrical signal application electrode provided in the oscillator,
wherein the electronic circuit has the functions to select a specified frequency component from frequency components of the electrical signal or convert the frequency components to a specified frequency, or to give a predetermined modulation to the electrical signal to conduct a predetermined demodulation or conduct a predetermined detection.

20. A thin film piezoelectric resonator comprising a resonator having the piezoelectric element according to claim 1 formed above a substrate.

* * * * *